US009607271B2

(12) United States Patent
Papile

(10) Patent No.: US 9,607,271 B2
(45) Date of Patent: Mar. 28, 2017

(54) ISOTHERMAL QUANTUM COMPUTING APPARATUS AND MATERIALS

(71) Applicant: Christopher Papile, Arlington, MA (US)

(72) Inventor: Christopher Papile, Arlington, MA (US)

(*) Notice: Subject to any disclaimer, the term of this patent is extended or adjusted under 35 U.S.C. 154(b) by 0 days.

(21) Appl. No.: 14/951,831

(22) Filed: Nov. 25, 2015

(65) Prior Publication Data

US 2016/0189054 A1    Jun. 30, 2016

Related U.S. Application Data

(63) Continuation of application No. 13/947,073, filed on Jul. 21, 2013, now Pat. No. 9,231,707.

(60) Provisional application No. 61/741,485, filed on Jul. 21, 2012.

(51) Int. Cl.
*G06N 99/00* (2010.01)
*H04B 10/70* (2013.01)
*B82Y 10/00* (2011.01)
*H03K 19/195* (2006.01)

(52) U.S. Cl.
CPC ............ *G06N 99/002* (2013.01); *B82Y 10/00* (2013.01); *H03K 19/195* (2013.01); *H04B 10/70* (2013.01); *G06N 99/00* (2013.01); *Y10S 977/933* (2013.01)

(58) Field of Classification Search
None
See application file for complete search history.

(56) References Cited

PUBLICATIONS

Karski, State-selective transport of single neutral atoms, Doctoral Thesis, Rheinischen Friedrich-Wilhelms-Universitaet Bonn, 2010, pp. 1-252.*

* cited by examiner

*Primary Examiner* — Wilbert L Starks
(74) *Attorney, Agent, or Firm* — Lambert & Associates; Gary E. Lambert; David J. Connaughton, Jr.

(57) ABSTRACT

The subject matter relates to multiple parallel ensembles of early stage spherical pulses radiated through engineered arrays forming the foundation for quantized computer processors taking advantage of integer thermodynamics. The materials, architecture and methods for constructing micro- and/or nano-scale three-dimensional cellular arrays, cellular series logic gates, and signature logic form the basis of small- and large-scale apparatuses used to execute logic, data bases, memory, mathematics, artificial intelligence, prime factorization, optical routing and artificial thought tasks not otherwise replicated in electron-based circuits. Unlike prior art electric-current based computational devices—that by definition dissipate heat and consume significant power to achieve computational output—the types of logic gates described do not shed waste heat and minimally consume power, which is desirable for embedded computers, ultra high-throughput computation, low-power consumption data centers and extended battery life devices.

20 Claims, 12 Drawing Sheets

COS(2θ)

ISOTHERMAL QUANTUM COMPUTING APPARATUS AND MATERIALS

BACKGROUND

Field

The subject matter disclosed herein relates to spherical electromagnetic pulses radiated through engineered arrays forming the foundation of quantized computer processes and apparatuses that utilize the integer properties inherent to said pulses and arrays.

Information

Continuum mechanics engineering models lose relevance as the ratio of surface area-to-volume in the system under consideration becomes exceedingly large. The prior art lacks sufficient engineering methods for controlling and constructing thermodynamic and heat transfer processes at the nanometer scale.

Today's commercial computing devices may utilize transistors with components on the nanometer and Ångström scale, and the transistors and the logic gates that comprise them use electric current and semiconductors. But electric current, when put through transistors in logic gates, necessarily generates heat, generates unevenly distributed heat, generates heat that is in the vicinity of insulating and non-optimal heat transfer materials, may generate stray current, have wires that increase in resistance and capacitance per unit length as they become smaller and consumes significant power to execute logic and arithmetic operations. These significant problems are increased at the smaller scale, despite the fact that the industry standard component feature size in computer hardware in the prior art has progressively gotten smaller.

Generating the same or more heat within smaller-and-smaller nano-scale volume sources by definition challenges the available surface area for the heat removal. Hot spots and generally excessive heat, has several draw backs, including injuring long-duration operation of said transistors.

Even though the problem of heat generation in electric current based logic gates originates at the nano- and micro-scale, the end effect at the macro scale is that large and multi-user devices, such as data centers, consume massive amounts of expensive and environmentally taxing power to conduct operations and computer cooling. According to a 2012 article in the MIT Technology Review [Apr. 30, 2012], all computer operations combined in the world account for about 2% of the world's $CO_2$ emissions due to power consumption, which is almost as much as the Aviation Industry. While at the hand-held and still smaller scale, batteries are burdened by the processes conducted by embedded integrated circuits.

The computer hardware industry's quest to increase the number of gates on a chip is impeded by heat removal and power efficiency inherent to electron-based computation and made worse at the nanometer scale [Microprocesor Architecture, Jean-Loup Baer, 2010, Cambridge University Press, Computer Architecture, John Hennessy & David Patterson, Third Edition, 2003, Morgan Kaufman]. Ongoing development work for some decades has sought to decrease power requirement per computation or to provide cooling for ever smaller transistors.

3D stacked chips based on electric current offer an intriguing hope for increasing computing power per unit volume. However, the prior art for 3D stacked chips has significant gaps. For example, putting transistors, which generate heat, in a micro-scale or millimeter-scale multi-stack by definition decreases the surface area available for heat removal. Despite all the efficiency increases projected for 3D electric-current based chip stacks, they will always consume significant power per computation; therefore, burden batteries, limit embedded devices, and foreshorten the customer's experience. The all electric-current-based microprocessor paradigm may be close to running its course.

Heat dissipation in electric current based gates whether in 3D or 2D chips indicates that such electric current based processes are irreversible. Irreversibility can be a useful property, since a definite result is sought; however, irreversibility derived from high heat dissipation per computation is a high energy price in classical computers.

Additional difficulties with the electric-current based paradigm include the prime factorization of large numbers. Encryption and defeating public-key cryptography schemes such as RSA, utilizing prime factorization of a large integer on a classical irreversible electric-current based computer is said to be infeasible or consume impractical amount of computing time (more than polynomial with input size) ["Polynomial-Time Algorithms for Prime Factorization and Discrete Logarithms on a Quantum Computer", Peter Shor, 1996 & 1994, The $35^{th}$ Annual Symposium on the Foundations of Computer Science].

Containing information in quantum form and the ability to manipulate quantum information may enable tasks that would be unachievable in a classical electric current based computer, including, the unconditionally secure transmission of information.

Superconductor based [D-Wave type devices] may offer a high computation capability which perhaps (but not yet proven as of the time of writing this document) could address some of the benefits of quantum computing. Yet today's superconductors tend to operate at temperatures well below ambient, thus requiring refrigeration and insulation. Computers based-on cryogenic temperature range superconductors cannot, without additional technology breakthroughs, reasonably be placed in small embedded computing devices nor can they likely offer relief to computer data center power consumption.

The public domain literature describes aspects of optical computing, which is sometimes referred to photonic computing. Literature reference to optical computing usually does not include quantum computing. Optical logic gates, optical switches, optical interconnections, and optical memory have been fabricated, but hybrid electric current optical devices are most often discussed as realizable. The prior art for light-based computing lacks practical, petit apparatuses. Lasers are commonly considered the source of illumination, but light-emitting diodes are also considered frequently for increased tolerance to noise. However, reliance on these light sources utilizes significant power to operate, may require materials to be maintained at temperatures well below room temperature and they use well-developed plane waves, not taking advantage of the properties of newly initiated spherical radiating waves. In this regard, although the current work uses radiating pulses, the term optical computing is not applied to the current work.

The prior art lacks a low-to no heat dissipating computer; irreversible (without heat generation) computing processes; ultra low power consuming CPU/ALU for embedded high-throughput computations; fast prime factorization capable low cost computer; low power consuming data centers; methods for engineering energy transfers on the nanoscale; a method to increase gate density on a chip surpassing limitations from transistor heat generation; and practical optical computing devices.

Research is ongoing to improve microprocessors. Since the scale of integrated circuit unit operations have decreased, such as transistors in the low nanometer or even Ångström-level, applicable engineering laws at this level are underway, and essential for a breakthrough in microprocessors.

Various expositions have been written on the potential role of Integer thermodynamics at the very small scale [Donald Chakeres, Harmonic Quantum Integer Relationships of the Fundamental Particles and Bosons, Particle Physics Insights, February 2009]. Experimental results show the existence of what may be expected intuitively: at the very small scale thermodynamic interactions may be quantized.

Regarding the Quantum Hall Effect, the von Klitzing discovery shows quantized integer fractions for resistance magnitudes that step up and maintain for specific plateaus as magnetic field is increased.

The integer quantum Hall effect is a quantum version of the Hall Effect observed in low temperature and strong magnetic field where it is experimentally verified that the Hall conductivity has quantized values relating the channel current to the Hall voltage through the e (elemental charge), h Planck's constant and an integer or fractions of integers.

Thus the Hall conductivity or resistance can take on either integer or integer fractional values. As can be immediately clear, quantized fractional integer Hall conductance is uniquely precise, since it is the ratio of integers.

Experimental measurements of the Hall conductance display integer fractional multiples of $e^2/h$ to nearly $10^{-9}$ precision. Presumably, the theoretical quantized values are exact, and the experimental results are accurate to 1 part in a billion. A computer with this level of accuracy (exact or $10^{-9}$ accuracy) in mathematical manipulations would be beneficial particularly if that accuracy carried through in integer thermodynamic equations.

Roemer and Sohrmann report electron-electron interactions within the integer quantum Hall regime, where the presence of a strong magnetic field and two-dimensional confinement of the electronic system profoundly affects thermodynamic and transport properties. [Roemer, Rudolf A. and Sohrmann, C. (2008) *Hartree-Fock interactions in the integer quantum Hall effect*. Physica Status Solidi. B: Basic Research, Vol. 245 (No. 2). pp. 336-343]

Prime factorization using a quantum computer is a goal for a direction of new microprocessor research [Nature Physics Volume: 8, Pages: 719-723 August 2012); Computing Prime Factors with a Josephson Phase Quibit Quantum Processor, John Martinis, et. al.] And Integer research in physics has continued and growing interest.

There may be generally valid thermodynamic relationships that function at the quantum integer fraction level that are applicable to engineering systems at the very small scale. Moseley's law is another quantum property that may be an indication of the reach of said phenomenon. Indicating there may be quantized thermodynamic inter-relationships governing physical properties at the very small scale.

In the current work, the term "quantum" is used for several reasons which will become evident throughout this description of the apparatuses, methods and materials. Reported in the current document are findings in quantum integer thermodynamics and their application to engineering a radiating pulse-based quantum processor.

BRIEF DESCRIPTION OF THE FIGURES

Non-limiting and non-exhaustive features will be described with reference to the following figures, wherein like reference numerals refer to like parts throughout the various figures.

radius at n=−½ for 6C4 drawn inside the n=0 cell of 6C4.

Figure 6:
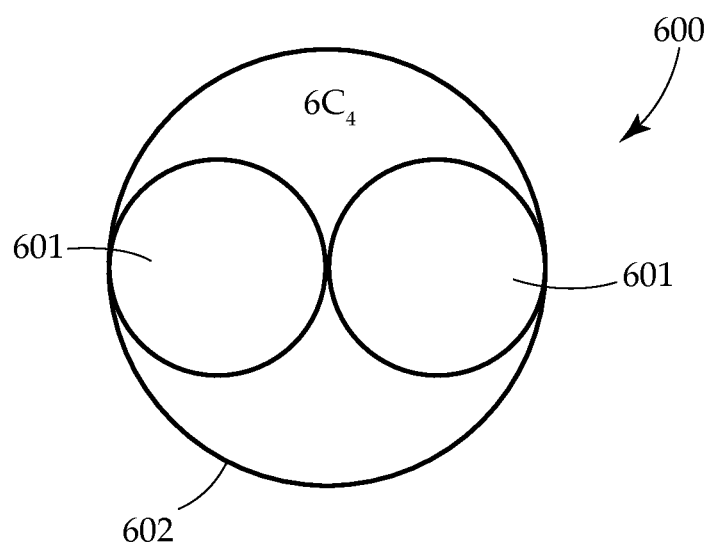

FIG. 6 is a schematic representation of the $$\left(\frac{\lambda}{32}\right)^{1/3}$$

radius at n=−½ which is equivalent to 2 lobes such as is observed for the first cell of 8S6, but drawn inside 6C4 n=0 sphere.

Figure 7:
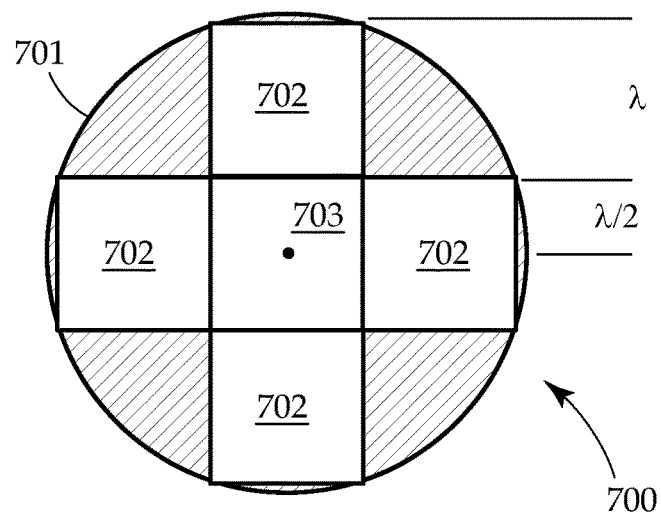

FIG. 7 is a schematic representation of n=0 and n=1 for octahedron cells in a 2-dimensional view showing λ=w=h=L pulse and disallowed volume in hash marks with allowed volume.

Figure 8:
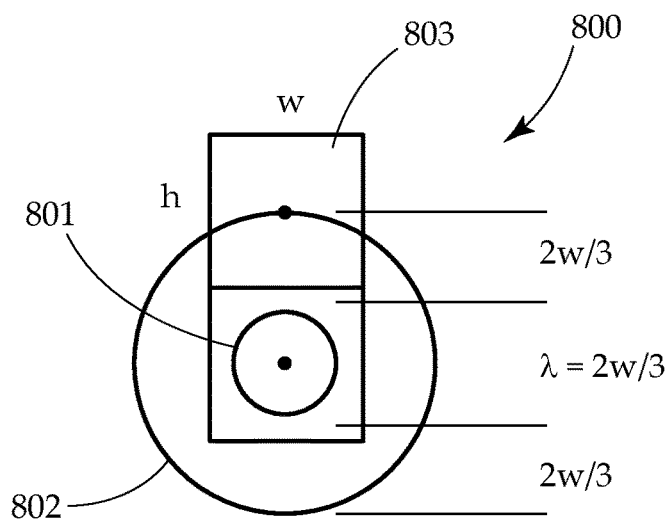

FIG. 8 in contrast, is a schematic two dimensional view of an n=0 and n=1 pulse frontier moving in two cell cubes where λ=(⅔)(w) and w is the width of the cube. It allows one to visualize pulses traveling from cube center to cube center.

Figure 9:
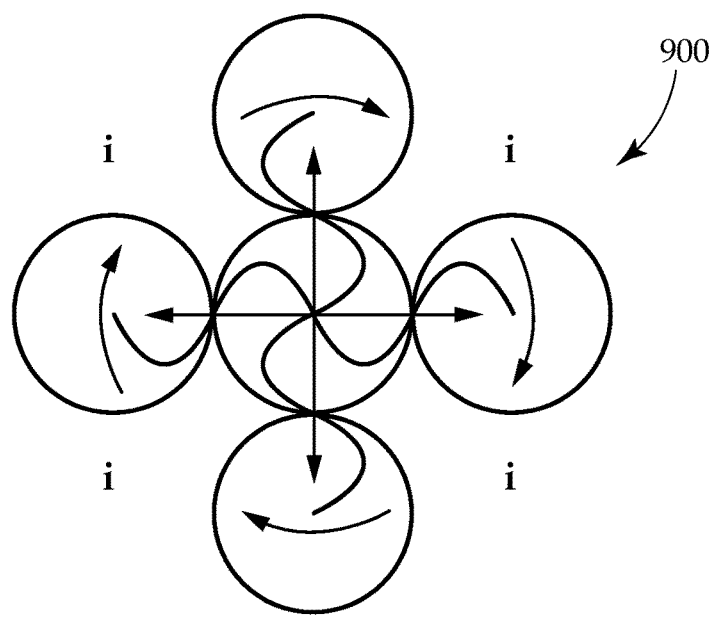

FIG. 9 is a schematic representation of a two dimensional view of 6C4 symmetry n=0 and n=1 lobes with the wave sinusoidal function and suggested spin.

Figure 10:
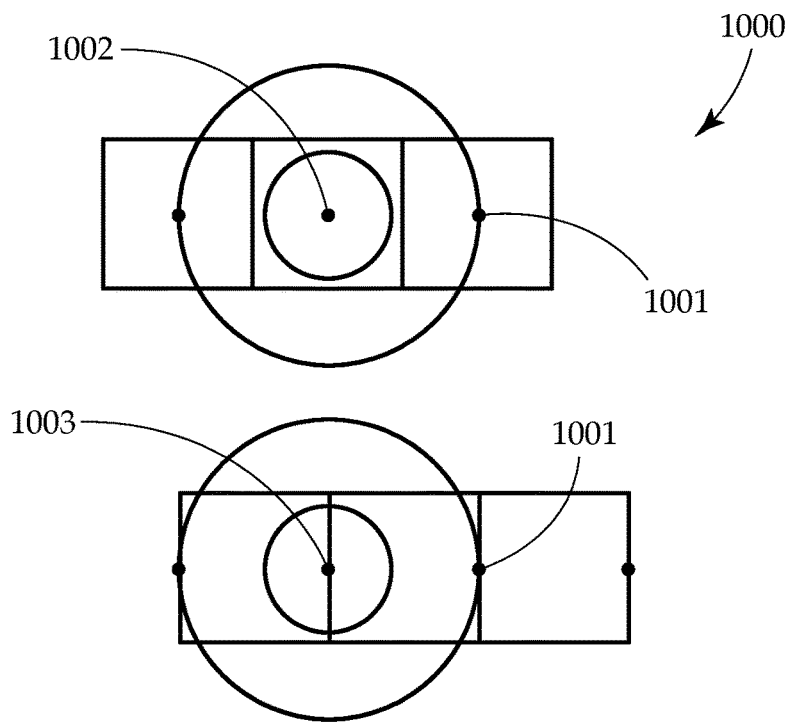

FIG. 10 is a schematic representation of two cell groups indicating that antenna-like sites may be placed in cell centers, or cell walls, or any location, so long as λ distances of n=0 and n=1 are maintained properly between antenna sites.

Figure 11:
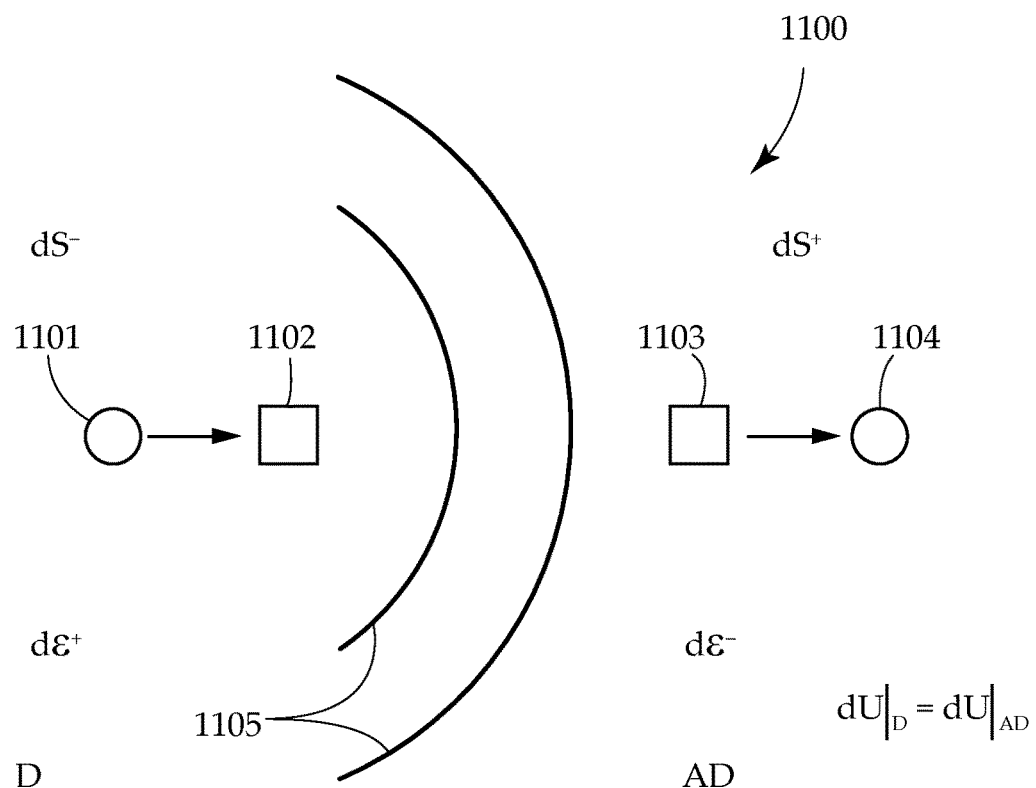

FIG. 11 is a schematic representation of paired events comprised of D which has negative entropy and event AD which has positive entropy but negative energy, d$e^-$. The small circles indicate that which has enhanced degrees of freedom and motion but can lose much of those degrees of freedom, when docked to the small box. The small box is relatively stationary compared with the small circles.

Figure 12:
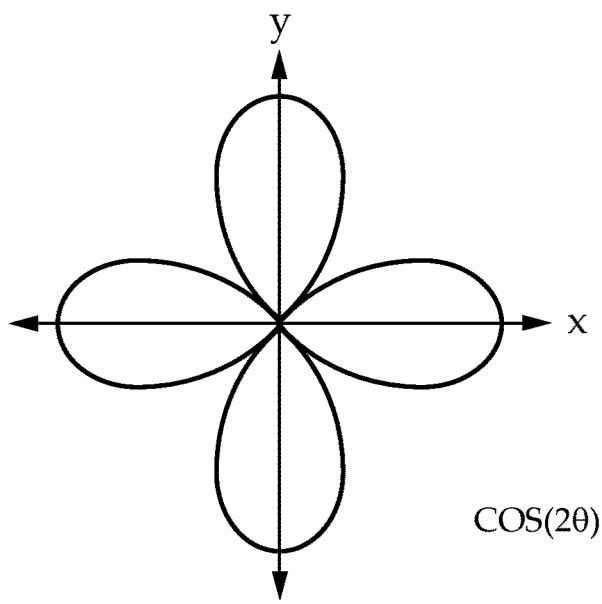

FIG. 12 is a schematic representation of the four-leaved rose shape of Cos 2θ.

Figure 13:
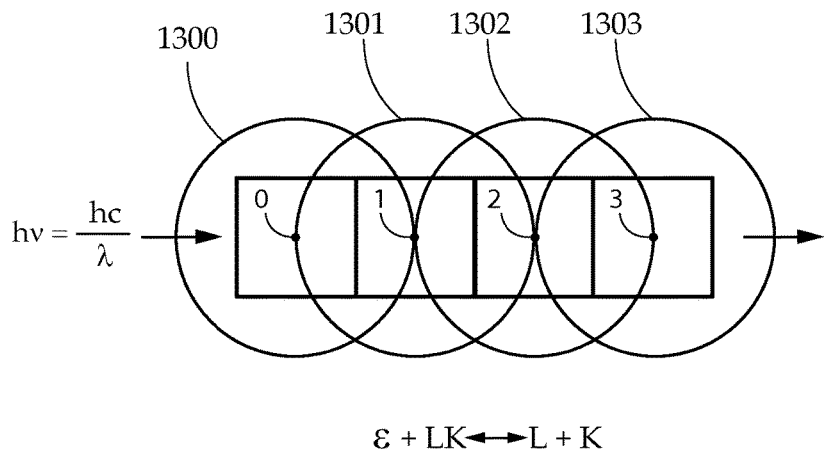

FIG. 13 is a schematic representation of a train of cells with intercellular reversibly moving pulses.

Figure 14:
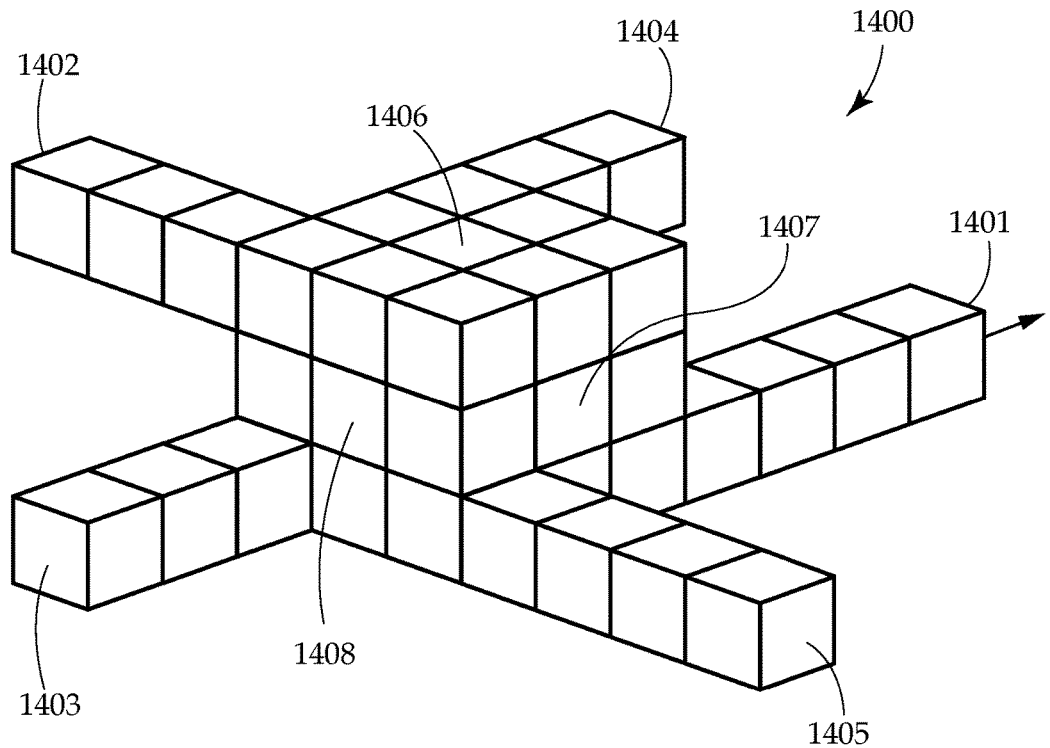

FIG. 14 is a schematic representation of a 27 cell cube which contains in it an octahedron of cells.

Figure 15:
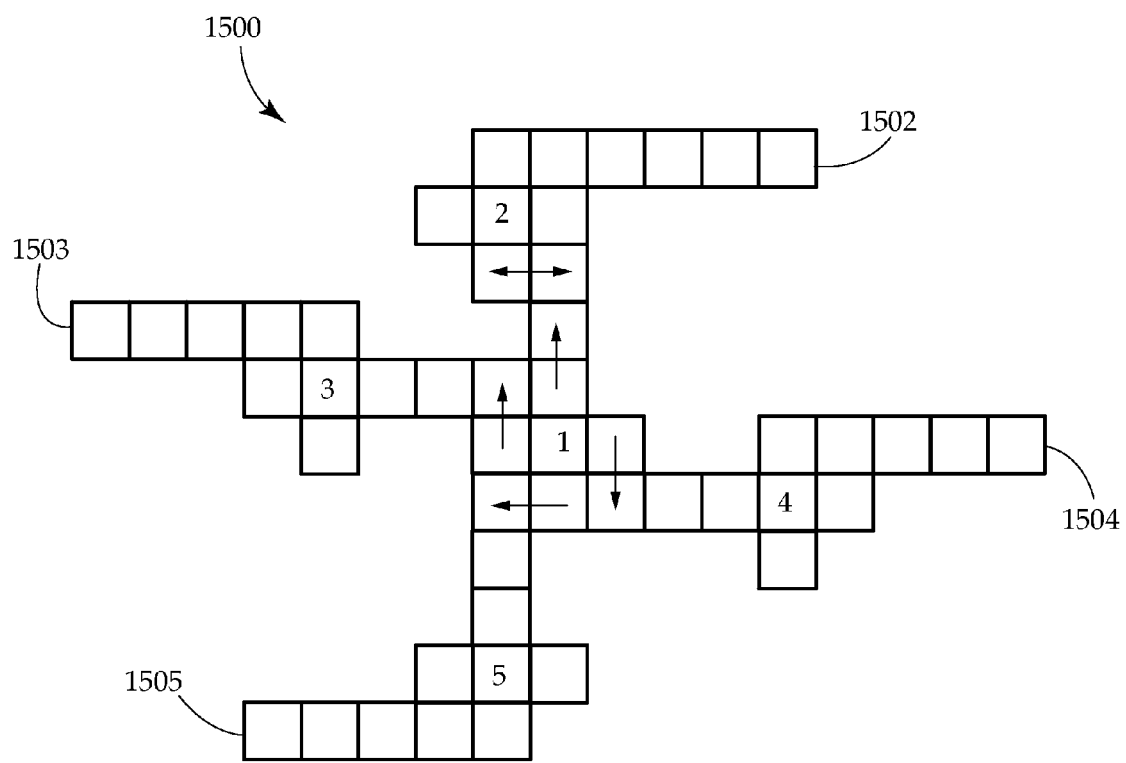

FIG. 15 is a schematic representation of a two dimensional view of five cellular octahedrons comprised of four cellular octahedrons connected to a central octahedron.

Figure 16:
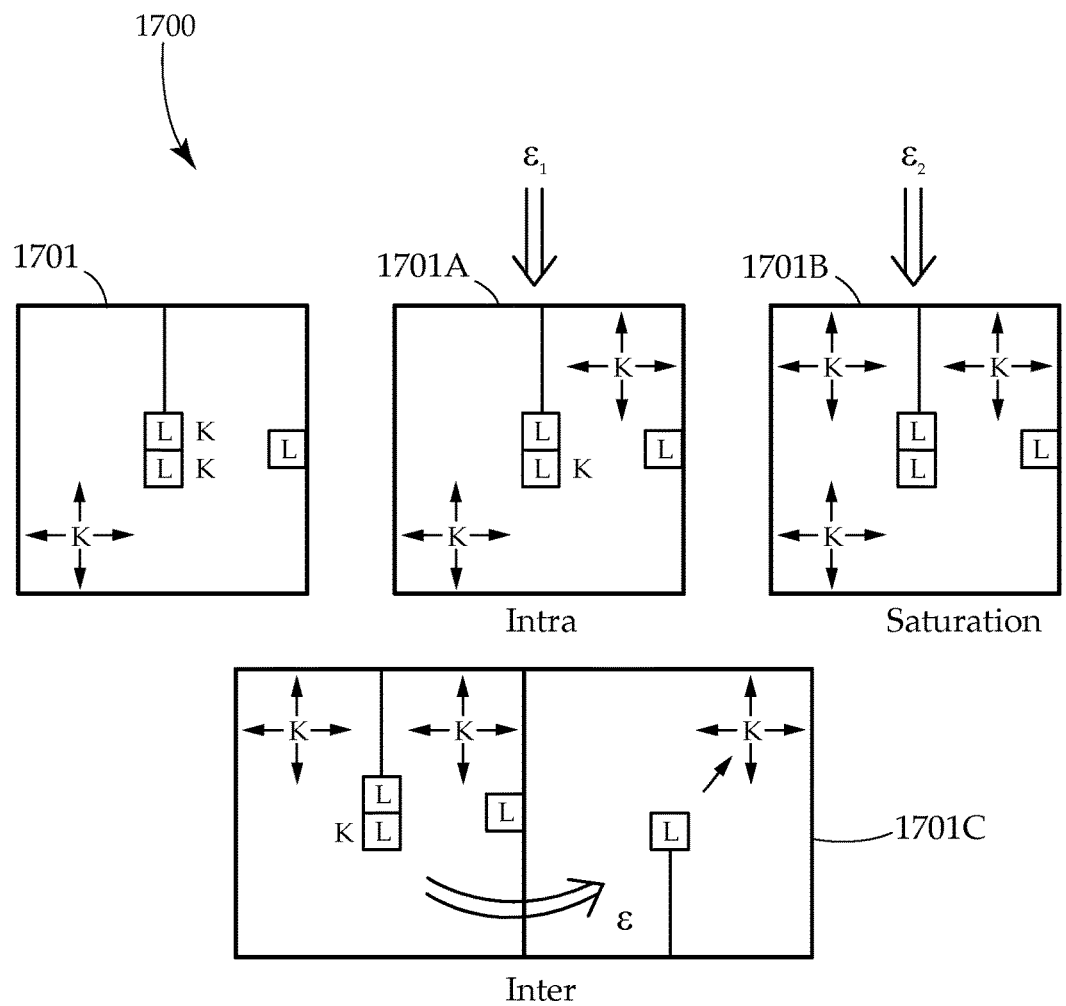

FIG. 16 is a schematic representation of cellular energy capacitance showing lock and key sites in cells which can accept some quantized energy input, but then become saturated.

Figure 17:
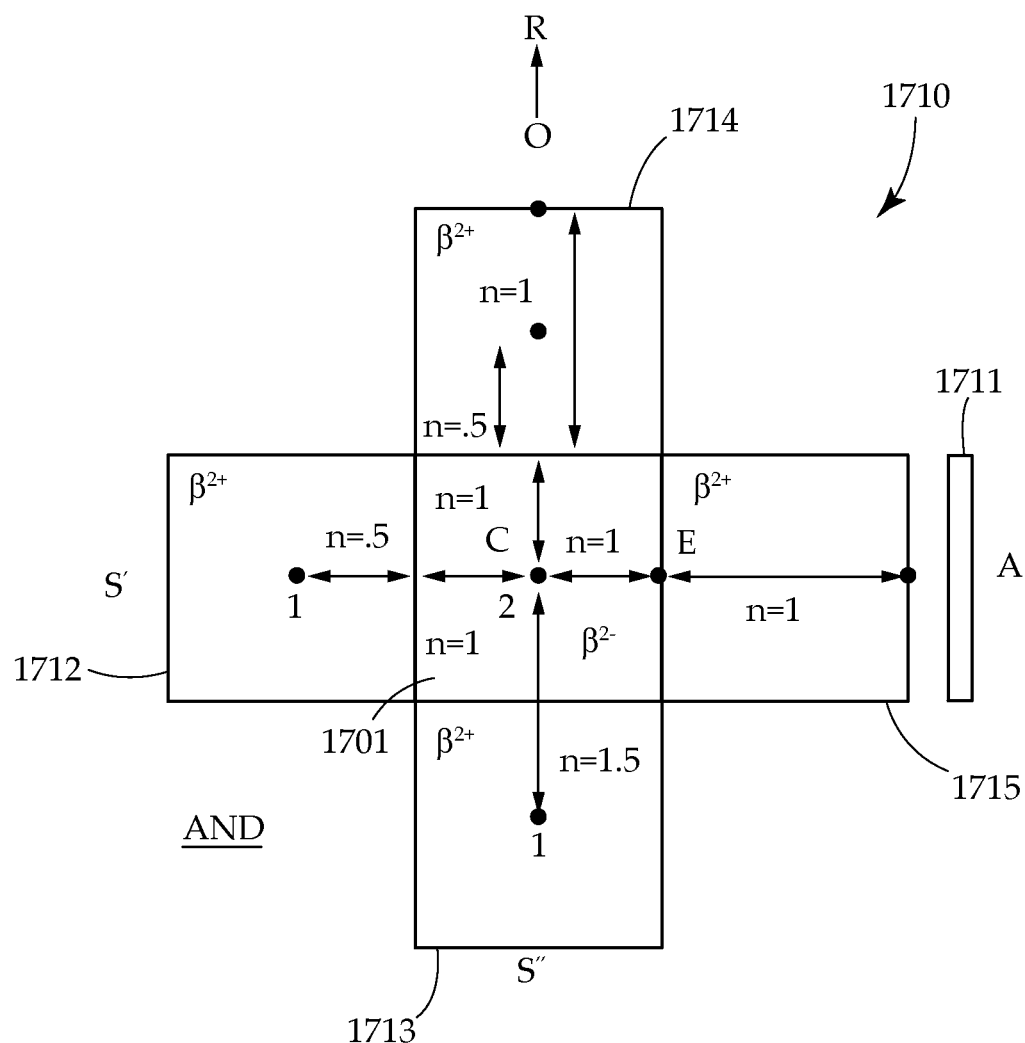

FIG. 17 is a schematic representation of an AND gate that operates using early stage electromagnetic spherical pulses.

Figure 18:
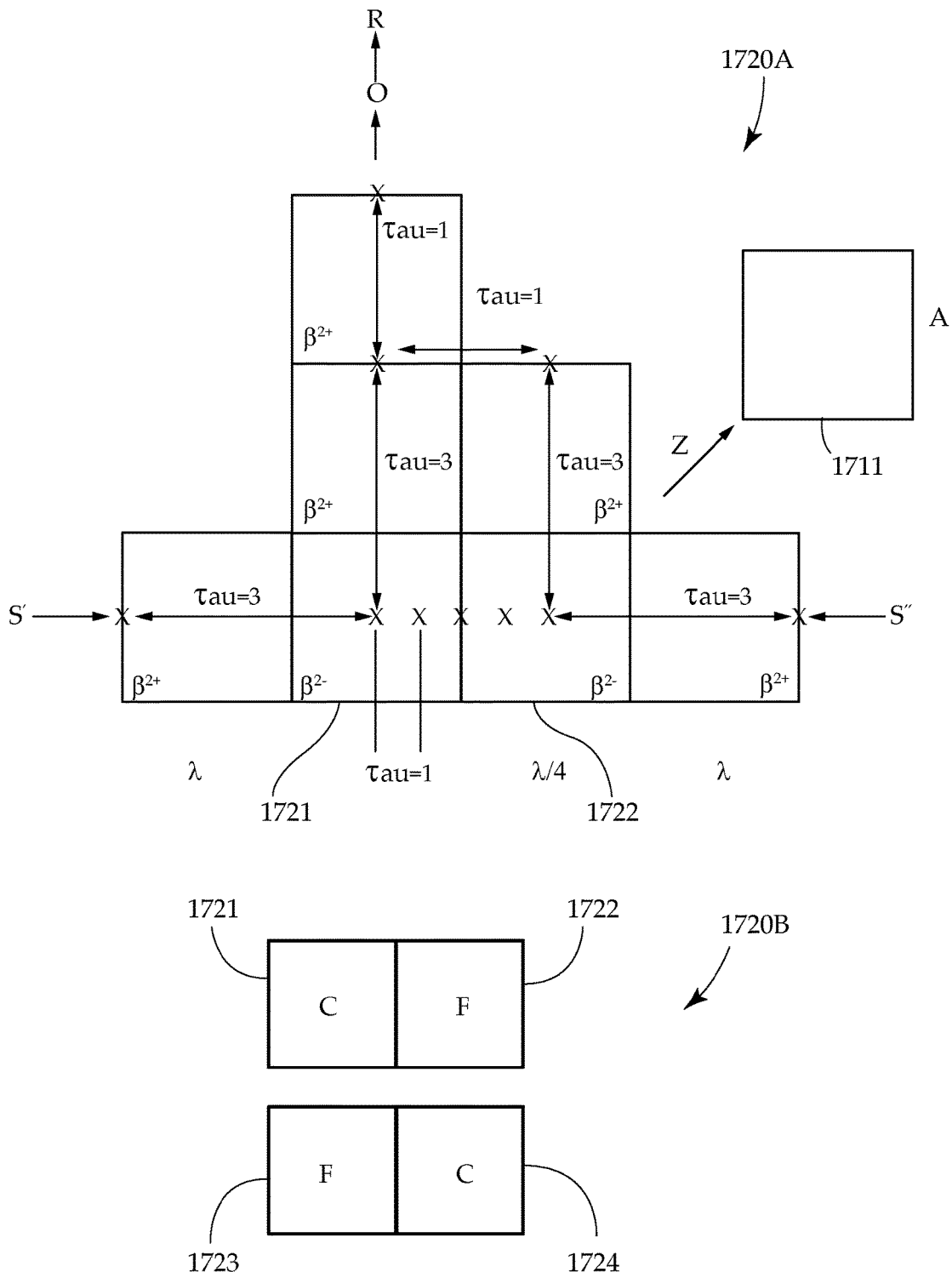

FIG. 18 is a schematic representation of an AND gate that uses λ/4 foreshortening by Index of Refraction increase and a dual capacitor to inhibit flow in non-useful directions.

DETAILED DESCRIPTION

Reference throughout this specification to "one embodiment", "one implementation", "an embodiment" or "an implementation" means that a particular feature, structure, or characteristic described in connection with the embodiment and/or implementation may be included in at least one implementation and/or embodiment of claimed subject matter. Thus, the appearances of the phrase "in one embodiment", "an embodiment", "in one implementation" or "a feature" in various places throughout this specification are not necessarily all referring to the same embodiment and/or implementation. Furthermore, the particular features, structures, or characteristics may be combined in one or more implementations and/or embodiments.

The methods and materials implemented in various ways shown herein rely on a series of numerical experimental results. Wherein light pulses moving within three dimensional arrays of cells, may represent and process information. Numerical results will first be described, then a summary of inventive features, and details on methods, materials and the architectural design of 3 dimensional cellular arrays hosting light pulse flow. The cellular arrays and light pulse flow are engineered to make new light based transistors, logic gates, 3D integrated light-based circuits, providing the function of a CPU and ALU together comprising the basis for new computer microprocessors.

The subject matter relates to multiple parallel ensembles of early stage spherical pulses radiated through engineered arrays forming the foundation for quantum computer processors taking advantage of integer thermodynamics. The materials, architecture and methods for constructing micro- and/or nano-scale three-dimensional cellular arrays, cellular series logic gates, and signature logic form the basis of small- and large-scale apparatuses used to execute logic, data bases, memory, mathematics, artificial intelligence, prime factorization, optical routing and artificial thought tasks not otherwise replicated in electron-based circuits. Unlike prior art electric-current based computational devices—that by definition dissipate heat and consume significant power to achieve computational output—the types of logic gates described do not shed waste heat and minimally consume power, which is desirable for embedded computers, ultra high-throughput computation, low-power consumption data centers and extended battery life devices.

The current work using the integer properties of pulses, may enable some of the extraordinary features proposed for quantum computers, such as prime factorization in polynomial time, and other useful features of prototype optical computers, such as a high degree of parallelism, in order to arrive at a new type of apparatus that embodies these features in a practical device that uniquely addresses society's computing needs.

Results:

The results described in this section are about the intercellular properties of nano and micro scale scaffolds for attaching pulse transmitters and receiver/re-transmitter, which can be utilized to build a computer microprocessor.

Transmitting and receiving nano and/or micro scale antenna array that form the basis of a computing device may be composed of a plurality of three dimensional cells, which in one embodiment has symmetric length (L), width (W) and height (H) each in the nano-to-micro range (between $10^{-9}$ to $10^{-4}$ meters) dimension, together generating a cell-volume.

The three dimensional cell walls are made of material that can anchor an antenna-like function of transmitting and receiving/re-transmitting. The term antenna-like is used, since pulses arise at a site in a cell coupled with a receiver either in the same cell, called intra-cellular transfer or in another cell, called inter-cellular transfer of the pulse energy. The receiver is identical to the transmitter and itself can retransmit the pulse. In this regard a pulse can radiate and move either forward or reverse within a series of cells, sometimes referred to as a cell train. The radiating pulses, in some cases may have the qualities of transverse electromagnetic waves. The claimed subject matter is not limited in scope to transverse electromagnetic waves.

The cell walls square of the Refractive Index - - -

$$\left(\frac{c}{u}\right)^2 = \mu^2,$$

where c is the speed of light and υ is the actual wave velocity within the medium of the cell volume - - - may be the same, similar or greater than the $\mu^2$ of the cell volume. The cell volume may be composed of a material with a practically constant $\mu^2$ throughout an individual cell. Square indices of refraction of interest are an index of refraction near 1 (for example 1.001±0.001) and/or a square index of refraction of 2.0±0.2, and square Index of Refraction pairs that are defined by changing the wave velocity to cause a pair of wavelengths that differ by integers of 2, for example, $\lambda_A = x\lambda_B$ where x=2, 4, 6, 8 . . . .

Consider a transverse electromagnetic (referred to as TEM or electromagnetic or transverse electromagnetic, interchangeably in this document) pulse of wavelength, λ, originating at the center of a cell as describe above and propagating in concentric spherical volume shells.

The energy density of the pulse is diluted by the increasing volume of the concentric volume shells—i.e. the volume between the surface of a sphere of radius $R_1$ and concentric sphere of $R_2$ where $R_2 > R_1$, found mathematically as the triple integral of the volume between the $n^{th}$ multiple of the wavelength and n+1 multiple. This symmetrical, increasingly growing, volume peel, around the center of a sphere where the pulse initiates, may at first have a radius half a wavelength (λ/2) of the TEM wave pulse, and increase in radius by λ with each n integer.

Where $V_{on}$ is the initial spherical volume of diameter, λ, Equation 1 can describe the ratio of the initial volume to increasing concentric volume sliver around the pulse center.

$$m_C^{-1} = \frac{V_{on}}{V_{n+1}} = \frac{\frac{4}{3}\pi\lambda^3}{\frac{4}{3}\pi\lambda^3[(n+1)^3 - n^3]} \qquad \text{Equation 1}$$

This method, which comes from the simple notion of a propagating spherical wave in a continuum manner, also may provide a quantized volume dilution (of the energy of the spherical wave pulse) in multiples of $m_c$.

Equation 1 can be seen as creating a cubic of $[(n+1)^3-n^3]^{-1}$ but it is more useful to view it as the quadratic, Equation 2, which naturally arises from the analysis of Equation 1. Equation 1, at first, seems to be a simple radial geometric calculation, but it contains a large amount of information, that is useful for engineering a cell array.

$$m_c = 3n^2 + 3n + 1 \qquad \text{Equation 2}$$

Equation 2 is similar to the Second Polynomial of Modified Spherical Bessel Functions of the Second Kind. Equation 3 is new to the prior art and equivalent to Equation 2 for $n \geq 0$.

$$m_c = \left[1 + 6\sum_{n=0}^{\infty} n\right] \qquad \text{Equation 3}$$

Equation 3 indicates a quantum progression of 6 wave periods provides the number of volume packets.

While based in the familiar physical quantities of wavelength, volume and wave period from a continuous concentric volume sliver approach, the volume terms that contain dimensions $$\frac{4}{3}\pi\lambda^3$$

cancel in the numerator and denominator of Equation 1 providing a dimensionless magnitude set out in quanta.

Let the total continuous volume of the band around a center point be represented by a set of discontinuous cell volumes with at least three properties: (1) volume locations where the TEM pulse is likely to be absorbed or (2) volume locations where the probability for pulse absorption is zero, and (3) arranged in such a way as to have a symmetry inversion center (i) around a center point.

Figure 1A:
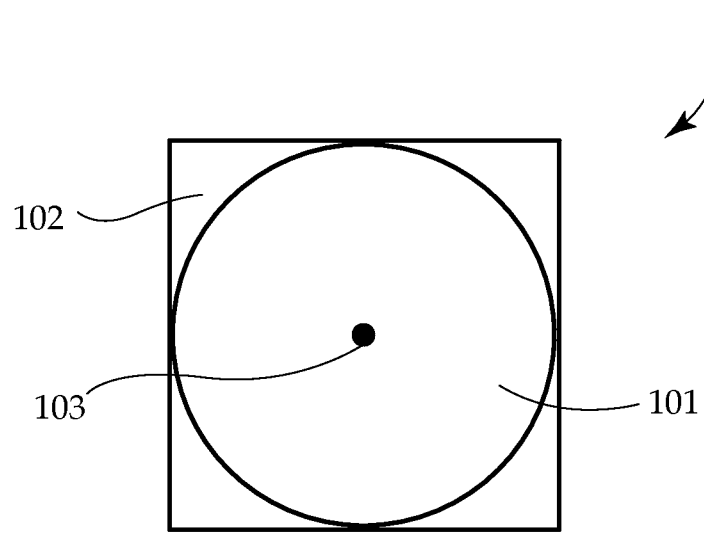
FIG. 1A is a schematic diagram containing item group 100 displaying in two dimensions of a single cell in an array based on 6C4 symmetry with a spherical pulse fully contained inside the cell.

The progression of quantized cell volumes can be visualized in two dimensions in FIG. 1A for n=0, where the circle (101) inside the box schematically indicates a spherical pulse that has not left the initial cellular cube. The cells of FIG. 1A are of symmetry type 6C4 which will be described in the paragraphs to follow. In FIG. 1A, item 102 is a two dimensional representation of the cell cube; and item 103 is the center of the sphere, where, for example, a TEM pulse transmitter and absorber/re-transmitter would be placed. The nomenclature for this document, pulses may be called lobes of probability for the population of states this term will especially be used if the probability volume is not in a single continuous sphere shape.

Figure 1B:
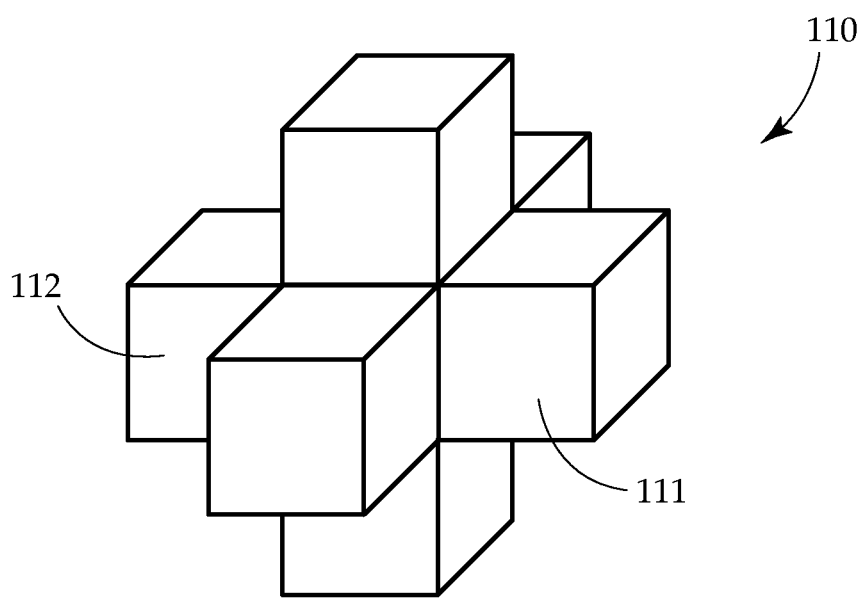
FIGS. 1B and 1C are schematic diagrams containing item groups 110 and 120 respectively 6 n=1 cells around a center initial, n=0 cell.
Figure 1C:
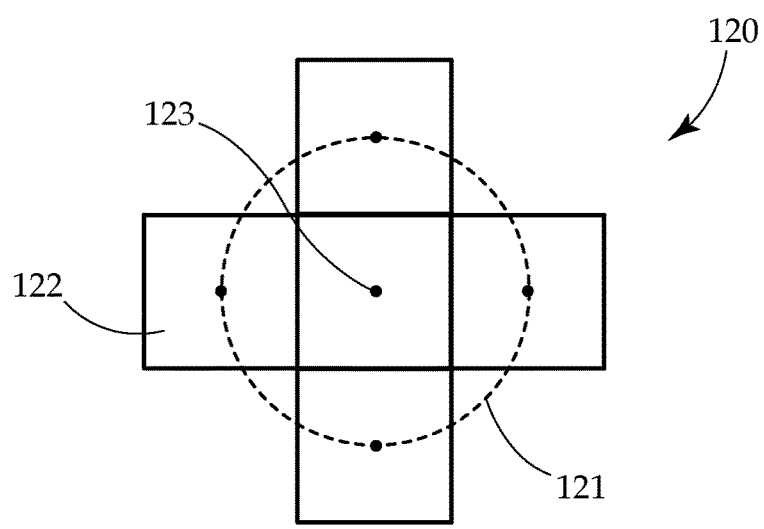

FIG. 1B shows a n=1 where each new identical cell volume is in contact with a face of the initial n=0 volume which is not visible in the Figure because it is in the center. Item 111 of FIG. 1B represents one of the boxes that encloses one of the spheres of n=1 and it is symmetrically equivalent to box 112 and all the external 6 boxes around the center box (which is not seen in this schematic diagram). The Figure shows an octahedron of cubes around a center cube. FIG. 1C shows a 2-dimensional representation where the circle imprinted through the centers of the new n=1 cubes is a schematic representation of a spherical pulse that has a diameter that enables it to reach the center of each n=1 cell. In FIG. 1C, the center of the pulse of the center cell, is marked 123 and would be where the n=0 pulse transmitter and absorber/re-transmitter would be placed in this example. The pulse perimeter, which would be more than two dimensions, is shown only in two dimensions and marked 121; and the two dimensional representation of one of the six boxes around the center cell box is marked 122. This 2-dimensional representation does not show the cube in front of the center cell and the cube behind the center cell as can be seen in the three dimensional representation of FIG. 1B.

Total cell numbers in FIGS. 1A (1 cell) & B (7 cells) are consistent with the $m_c$ integers. The $m_c$ integers are an inherent physical quantity, derived from Equation 1. Every exposed face of an n count is covered by the next n+1 count. Cells that are shared are counted half.

The cube is known point group symmetry Oh. The six faces of the first cell-volume at n=0 progresses to 6 new boxes covering those 6 faces with n=1, as shown in FIGS. 1B and 1C also of Oh symmetry. Here $$n = \frac{-3 \pm i\sqrt{3}}{6}$$

is origin for the pulse ($m_c$=0) and n=−½ provides $m_c$=¼. Octahedrons and cubes are two Platonic solids known to have the same symmetry. These two Oh Platonic solids when viewed as points in the center of the $S_6$ faces are also equivalent to a trigonal antiprism, which emphasizes that Oh symmetry also has eight $S_6$ symmetry sites.

Oh has a symmetry operation of inversion center (i) (note this is not the same as the symbol "i" for complex numbers), meaning a complete inversion across a line drawn through the origin from any two collinear peripheral points returns the same object.

The goal is to construct nano and/or micro scale antennae-like arrays for energy pulses to hop from cell-to-cell. Where there is no transmitting or receiving nano- or micro-scopic antenna-like sites, the probability for the pulse to move in that direction is zero. The allowed and disallowed sites also come out of the properties known for spherically radiating waves.

Referring again to FIG. 1B, when the radiation of the pulse is through the face of the box volume to the next box volume, and any box volume that shares faces with two previous boxes is only counted as half in the degenerate (symmetrically equivalent) cell count; Equations 2 and 3 naturally take these partial cells into account.

Here n may be considered in two ways: (1) the state level or (2) the progression of dimensionless time in quantum steps, which we can re-write as, $\tau$.

The notion of a wave traveling in time is familiar, but in this analysis, Equation 1, by virtue of the square term, inherently makes $\tau$ ($\equiv$n) a complex number. $|\tau|$ is the Modulus of $\tau$. In Cartesian mathematical form: $\vec{\tau} = a+ib$ or Radial from: $\vec{\tau} = |\tau|e^{-i\theta}$. The same can be written for $\vec{n}$.

Since each cell is composed of a volume, (L)*(W)*(H) =V, then (m)*V is a quantification of space. We can write $m_c$ as dimensionless space, Sp. Equation 4 is the same as Equation 3, just renaming n and m, as the dimensionless time, $\vec{\tau}$, and dimensionless space, Sp.

$$Sp = \left[1 + 6\sum_{\tau=0}^{\infty} \vec{\tau}\right] \qquad \text{Equation 4}$$

The engineering analysis for constructing devices could be carried forward using either reference to dimensionless time, $\vec{\tau}$, and dimensionless space, Sp, or by m and $\vec{n}$, with the same mathematical result; whatever form is presented, the other is straight forward renaming.

To physically visualize pulse movement in space and time it is helpful sometimes to convert $\vec{n}$ and $m_s$ equations to their equivalent $\vec{\tau}$ and Sp versions. The equations are presented in $\vec{n}$ and $m_s$ converted to radial complex coordinates:

$$\vec{n} = |n|e^{\pm i\theta} = |n|(\cos\theta \pm i\sin\theta) \qquad \text{Equation 5}$$

Equation 5 leads to integer equations for Sine and Cosine, when allowed angles are specified by Equation 7. The prior art uses continuous functions for the behavior of transverse electromagnetic waves, here it can be shown that fundamental integer functions come-out of the current numerical studies reported in this document with practical device engineering benefit.

$$\vec{n} = -\sqrt{\frac{2m_c+1}{6}}\left[\sqrt{\frac{3}{2(2m_c+1)}} + i\sqrt{\frac{(1-4m_c)}{2(2m_c+1)}}\right] \qquad \text{Equation 6}$$

when $$\theta = \pm A\text{Tan} \pm \sqrt{\frac{(4m_c-1)}{3}} = \pm A\text{Tan} \pm \sqrt{4n^2+4n+1} \qquad \text{Equation 7}$$

Equation 6 has ± forms of the imaginary part and modulus generating several solutions. When θ is defined as shown in Equation 7, the trigometric functions can be defined by integer relationships as shown in Equation Set 6B.

$$\cos\theta = \pm\sqrt{\frac{1}{4n^2+4n+2}} \qquad \text{Equation Set 6B}$$

$$|n| = \sqrt{\frac{2m_c+1}{6}}$$

$$i\sin\theta = \pm i\sqrt{\frac{(1-4m_c)}{2(2m_c+1)}}$$

The term $4n^2+4n+2$ that shows up in the new equations for Sine and Cosine has relevance to the Octahedron symmetry.

Equations 2 and 3 rely on (6) $C_4$ symmetry operations. Equation 8 is related to the (8) $S_6$ symmetry orientation of an octahedron. It is known in the literature that Oh objects have the following symmetry operations: E, 8C3, 6C4, 3C2, i, 6S4, 8S6, 3σ$_h$, 6σ$_d$. The 8S6 locations are at the 4 faces of the top pyramid of the octahedron and the 4 faces of the bottom pyramid of the octahedron. If volumes associated with this location would be counted they would correspond in number to the term found in the Equations 6, Set 6B and Equation 8.

$$m_s = 4n^2+4n+2 \qquad \text{Equation 8}$$

Again, even though a volume term was the starting point for the cube the equation becomes quadratic, and Equations 8 as well has n as a complex number, which may also be written in its vector form, $\vec{n}$. As in Equation 3, Equation 9 arises for the 8S6 octahedron orientation.

$$m_s = 2 + 8\sum_{n=0}^{\vec{n}\to\infty}\vec{n} \qquad \text{Equation 9}$$

Figure 2:
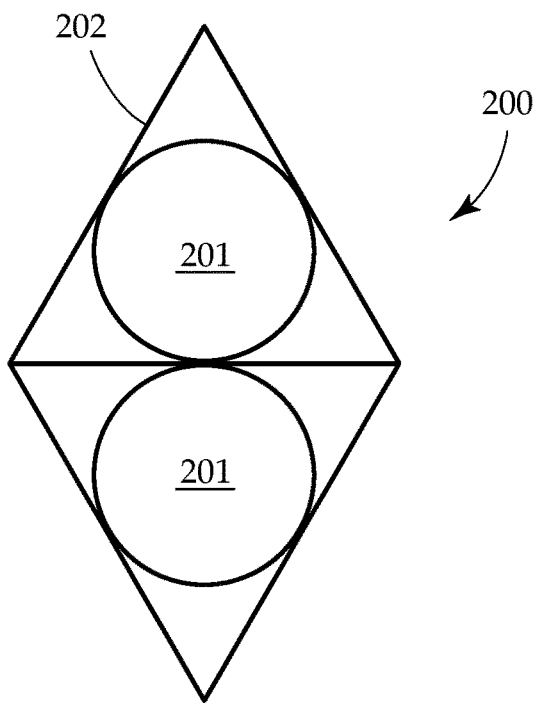
FIG. 2 is a schematic diagram containing item group 200 displaying in two dimensions of the first two lobes in the n=0, β=1. first cell of 8S6 symmetry sites in an octahedron.

FIG. 2 shows if (8) $S_6$, the n=0 was a cell with lobes, it would have a pulse energy in two identical lobes inscribed in the top and bottom portion of an octahedron. The item group 200 is a two dimensional illustration that provides only a sense for this, at least, three-dimensional octahedron shape with inscribed lobes. The identical spheres are reminiscent of the radiation field pattern of an electric dipole. Consider for example, the ultra near-zone field. Item 201 in FIG. 2 are the two lobes or spheres that are inscribed in top and bottom pyramids that meet at the bases of the pyramids. Item 202 indicates the top pyramid that composes, together with the bottom pyramid, an octahedron.

When constructing an antenna-like array for spherical pulses the transmitter-receiver/re-transmitter it may be possible to use cell arrays of physically constructed cubes, or paired in two half-octahedron, or in any Platonic solid that can by itself or in a group have an inversion center. In this work the octahedron of cubes came from Equation 1 and the (8)S6 mathematics arose naturally in the solution of the 6C4 cells. Although Equation 6 only makes reference to $m_c$, versions of $m_s$ come into the Cosine and A Tan Equation for θ.

The progression of the number of integer volumes may have a meaning in time: the proportion of the initial Re part of Time ($\vec{\tau}$) in its Complex Number form decreases with the progression of the pulse wave as shown in Equation 10.

$$\frac{n^2_{Real}}{|n|^2} = \cos^2\theta = \frac{1}{4n^2+4n+2} \qquad \text{Equation 10}$$

Again, the formula in the denominator of the integer form of the Cosine is the $m_s$ progression.

When TEM pulses radiate through an array of (6) $C_4$ or (8) $S_6$ cells, one can show (see Table 1 for non-exhaustive examples) that primes and semi-primes naturally arise, which is a useful property of the array.

TABLE 1

Pulse Components are Composed of Primes and Semiprimes

| A | B | C | D | E | F |
|---|---|---|---|---|---|
| $\vec{n}$ | $m_c$ ((4) $C_6$ Cells) | $\|n\|^2 n_{Real}^{-2}$ | Δ Column c-b | $+i\sqrt{\frac{(1-4m_s)}{3}}$ | The Primes |
| Pulse Number −1 | n Quantized Cell Volume | n modulus to Re part of n | Subtracted Value | | |
| −0.5 | 0.25 | 1 | 0.75 | 0 | 1 |
| 0 | 1 | 2 | 1 | 1 | 2 |
| 0.5 | 3.25 | 5 | 1.75 | 3 | 3 |
| 1 | 7 | 10 | 3 | 5 | 5 |
| 1.5 | 12.25 | 17 | 4.75 | 7 | 7 |
| 2 | 19 | 26 | 7 | 9 | 11 |
| 2.5 | 27.25 | 37 | 9.75 | 11 | 13 |
| 3 | 37 | 50 | 13 | 13 | 17 |
| 3.5 | 48.25 | 65 | 16.75 | 15 | 19 |

TABLE 1-continued

Pulse Components are Composed of Primes and Semiprimes

| 4 | 61 | 82 | 21 | 17 | 23 |
|---|---|---|---|---|---|
| etc. . . | etc. . . | etc. . . | etc. . . | etc. . . | etc. . . |

All of the counts of Table 1 correspond to particular cell levels within the cell array. By using (1) newly initiated spherical wave pulses, where the (2) initiation location of the pulse can be identified and noted or intentionally placed and the (3) cell level count at the READ point of the pulse is known, enables a microprocessor using this method a distinct advantage in factoring large numbers into primes and semi-primes.

In the usual approach to spherical waves it is known that Huygens' principle is true for only odd numbers of space dimension, where for one dimension the integration is performed over the boundary of an interval with respect to the Dirac measure. It is not satisfied in even space dimensions. However this Classical odd requirement does not provide practical tools to be used in prime factorization. In the current work, READ locations in the cell array, when the initiation point is known, correspond to a series of primes and semiprimes, as the Equations presented above show.

Figure 3:
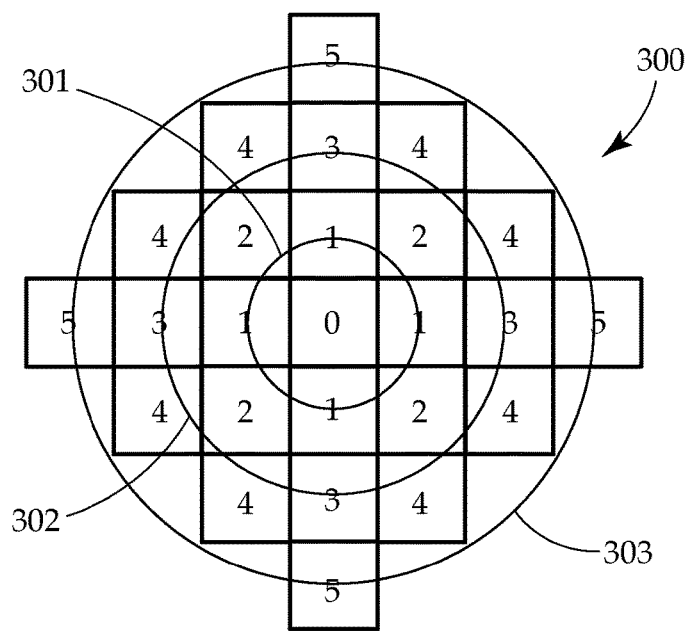
FIG. 3 is a schematic diagram containing item group 300 of a 2 dimensional view of several shells for 6C4 cell array.

The progressions of $m_c$ is shown in FIG. 3. FIG. 3 is a two dimensional representation. In FIG. 3, item 301 is a two dimensional representation of the n=1 pulse sphere, item 302 indicates the n=2 pulse shell and 303 indicates the n=3 pulse shell. Note that in FIG. 3, for n=2 the shared cells are indicated as "2" shown in the center of those cells and the unshared n=2 cells are marked as "3". The cellular array fills the space more and more like a sphere as n progresses. FIG. 3 only shows two dimensions but the cells are also being added coming out of the page towards the viewer and away from the viewer. The cells are built up by covering the faces of each cell in the preceding n level with new cubes. For example, if the faces of the three dimensional diagram of n=1 in FIG. 1B are each covered with new cubes, then the n=2 level is represented.

Further, the prior art of nascent optical computers describes fully developed plane waves generated in lasers. These groups of planar waves are divorced from their initial wavelength count, whereas the pulses of this document are generated in a way that their precise wave period count corresponds to cells in the foundational three dimensional antenna-like array.

Since the numerical results of this work show that light pulses are composed of primes and semiprimes, a computational device using spherical pulse waves instead of the motions of electrons can be arranged so as to compute prime factorization and may require orders-of-magnitude less computational operations than ever encountered before.

Figure 4:
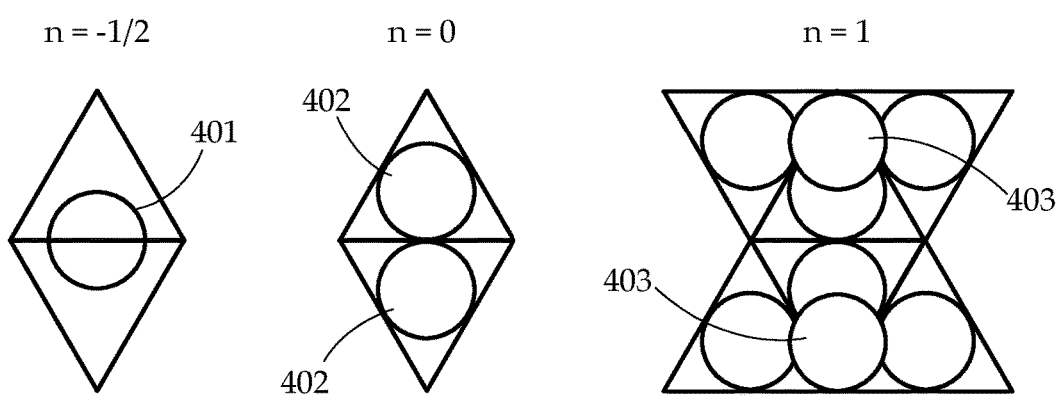
FIG. 4 is a schematic representation of the progression of n from −½ to 1 of the 8S6 symmetry cells which are containing spherical pulses.

FIG. 4 shows 8S6 cells (depicted as triangles connected at the base) if they contained pulses (depicted as circles, for example, item 401 is the first lobe of the n=-½ cell). For n=-½ there is one lobe having the volume of one half of the total volume of the first, n=0, cell lobes (shown as identical items 402); for n=0 there are two lobes in two pyramidal cells forming an octahedron representing one λ of the first, n=0, cell, before any inter-cellular energy transactions; and the n=1 lobes (two of the 8 lobes are indicated at item 403) in pyramid shaped cells are shown in the last representation. The n=1 cells extend in three dimensions, but the Figure only shows a two dimensional representation with two lobes that would come out of the paper superimposed on top in their relative positions to provide a sense for the three dimensional arrangement. There would be ten n=1 lobes, as indicated by the equation at the bottom of FIG. 4, if 8S6 would house pulses, around the central n=0 lobes at each face of the 8S6 position.

Figure 5:
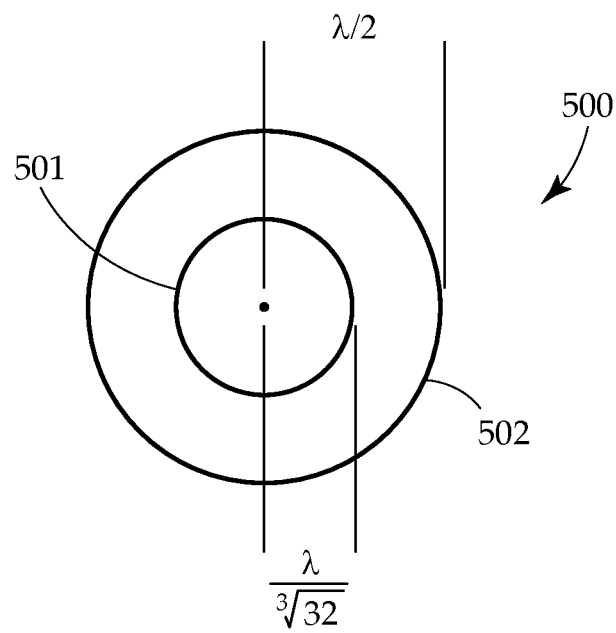
FIG. 5 is a schematic representation containing item group 500 of the $$\left(\frac{\lambda}{32}\right)^{1/3}$$

In FIG. 5 for (6) $C_4$ the first, n=0, cell (item 502) has a pulse of radius λ/2 and a smaller inscribed volume of radius, $$r = \frac{\lambda}{\sqrt[3]{32}}$$

(item 501) that is manifest at n=-½, in which the imaginary part of $\vec{n}$, and θ are zero (0), as evident from Equation 6, 7 and/or Equation 10. But the first cell, n=0, in the case of (6) $C_4$, may be further de-convoluted.

The inscribed cube-root-of-32 (just more than the value for π) radius is positioned as shown in FIG. 6. FIG. 6 shows item group 600 that arranges the inscribed volume in an analogous way that the lobes of (8) $S_6$ volume are arranged at n=0. Here the cube-root-of-32 placed are two λ/4 radius spheres (identical items 601 which are two dimensional representations of spheres) inside the volume of (6) $C_4$ (item 602 is a two dimensional representation of that volume). The two smaller volumes in the shape of n=0 ((8) $S_6$) in FIG. 4 add to the $$r = \frac{\lambda}{\sqrt[3]{32}}$$

radius of the inscribed volume (inside the first volume for (6) $C_4$).

This description applies for an Index of Refraction Square $\mu^2$ and $\beta^2$ of 1.0 and a cell width=length=height=λ matching in size, as built into Equation 1. Increasing $\mu^2$ to decrease λ will cause a mismatch between the cell width and λ which will change how the lobes are depicted in the cells. The next section of this document is describes the combination of pulses and arrays.

For 6 $C_4$ at n=-½, which is equivalent to the ½ a wave-period, Equation 2 provides that ¼ of the volume of a full λ is represented. Each of these smaller spheres would have half the diameter of a sphere inscribed in an associated 6C4 cube. The volume of those two spheres have ¼ the volume as the full λ as shown:

$$\frac{2\left(\frac{\lambda}{4}\right)^3}{\left(\frac{\lambda}{2}\right)^3} = \frac{1}{4}$$

In the next section of this document it is shown that for $6C_4$ at n=-½ the ¼ volume arrived at from Equation 2 has no pulse energy transfer (at $\beta^2$ of 1.0 and a cell width=length=height=λ).

This section described creating quantized volumes of allowed and disallowed places the pulse may reside starting from Equation 1. These numerical results may be the start point for analyzing TEM pulses from the point of view of a number of states and population of states. The next section is focused on the population of states, or the energy pulse within the cellular array.

FIG. 7 shows item group 700 indicating the use of λ=w=h=L, here there quantized allowed volumes in the 6C4 octahedron sum to the volume of the continuous function of Equation 1. The hashed area of FIG. 7 shows (indicated by 701) a volume where the TEM pulse photon does not have a probability to find an absorber. 702 shows four of the 6 n=1 cells and item 703 shows the n=0 cell in the center.

FIG. 8 shows in item group 800 the orientation that will be used in depicting the pulses for transistor design, since it is easier to visualize the pulse traveling from the center of each cell. In FIG. 8, item 801 is a n=0 sphere that has a diameter of ⅔ the width of the cell cube. Item 802 shows the growth of that n=0 sphere to the next n=1 shell that has grown by ⅔ the width of the cell cube all around the inner sphere. In this case, the n=1 shell is shown to reach to the center of the next cell cube, item 803.

The analysis was set up to convert continuous volume to discontinuous volume packets that maintain the same total volume but split the volume into allowed and disallowed locations for the photon to probably reside. The allowed and disallowed lobes must have the same symmetry as the continuous sphere volume.

It is known that photon net angular and linear momentum must balance. For spherical radiating pulses symmetry requirements at each $\vec{n}$ level must be maintained. It can be shown that in order to satisfy all these requirements, the lobes outline according to the current analysis have spin. FIG. 9 provides a visual sense for the need for photon spin in item group 900. FIG. 9 shows a two dimensional view of n=1, 6C4 octahedron pulse lobes, without showing the cubes around the lobes. The photons are represented by a head and a tail. Referring to FIG. 9 the four places that the lobes are not found in the static drawing are marked as "i" to indicate those are also inversion centers.

The results found here are focused on quantifying cell volume quanta and these results will be related to a number of states used in a thermodynamic analysis uses number of states and population of states in the next section. Within the nth state there is a quantity for population of states and number of states that may be calculated using integer equations shown in this document. Between the nth state and the n+1 state differential thermodynamic properties of the population of states can be calculated using the integer equations in this document.

Calculating the photon "tail" as originating in the n state-level, while the head goes toward the n+1 state-level, enables differential calculations of thermodynamic properties between states.

Indicated inside the spheres is a sense for the wave function emanating in every direction with positive differential energy and negative differential work followed by negative differential energy and positive differential work changes. Inversion centers of symmetry through the center must be maintained. The angular momentum left to right top to bottom of the photons in FIG. 9 should also cancel. The spin of the photons across symmetry inversion must be identical. Linear momentum between photons must be maintained.

The n=0 center lobe of FIG. 9 is not the origin center, the origin center as described previously is at $$n = \frac{-3 \pm i\sqrt{3}}{6}.$$

The wave originating at the center point would proceed in each λ/2 direction with the positive and negative values of the electro and magnetic waves positioned on either side of the center point.

Pulse transmitter-receiver/re-transmitter pairs may be easier to fasten to the cell walls as compared to the center of the cell. The dot in the middle of the cell—meant to indicate an antenna-like transmitter, can equally be on the cell wall, so long as the adjacent antenna-like sites are at the same corresponding distances, as shown in item group 1000 of FIG. 10. In FIG. 10, the antenna-like site is either positioned at the center of the cell (1002) or on a wall (1003). But the distances between antenna-like sites are the same, so that point 1001 could be the same both three-cell depictions shown.

Transistors may be built using pulses of many λ to cell width w ratios, so these depictions are chosen for visualization purposes and are not meant as the only examples of how to build a transistor from a combination of cell array and TEM pulse.

Equation 6 shows the modulus of n as the first of three terms, which in radial complex coordinates is the magnitude of the $\vec{n}$ vector. The Im part of Equation 6 contains a dependence of a ratio that—has a 8S6 functionality in the numerator and a 6C4 functionality in the denominator. Two values of interest for the Im part, the third term of Equation 6 are $n_{Im}=0$ and $n_{Im}=-1$ for $(n=-½, m_c=¼)$, $(n\to\infty, m_c\to\infty)$ respectively. The next section is about population of states. Results, P and M Integer Quantification:

Further results related to integer wave quantification are derived by defining the thermodynamic system boundaries of the pulses acting within the cellular array. Illustrative embodiments of materials used and examples from nature are provided in the next section.

A TEM pulse may be generated when a simultaneous instantaneous loss of a group of system states, referred to differential negative entropy, $dS_c<0$—as opposed to ΔS of a cycle which would allow individual dS to be negative. The criteria here is when differential entropy is negative (−dS) something else has to happen to enable an equal and opposite +dS.

The internal energy change of the $dS_c<0$ event will be partnered with at least one equal and opposite $dS_c>0$ step. In some instants there will be a simultaneous field of quanta of events where the internal energy of all the $dS_c<0$ events are equal to the internal energy of all the $dS_c>0$ steps $$\Delta U|_{Neg.dS\ event} = \Delta U|_{Pos.dS\ Event} \quad \text{Equation 11}$$

The dSc<0 step is generated by Body Force action. At the nanoscale a Body Force example, is simply when a molecule, ion or electron collide with another such species. In these events, for a special case of $\beta^2=1$ (to be described in the next section) the second derivative of internal energy is zero.

$$\left(\frac{\partial^2 U}{\partial B^2}\right)_{moles} = 0 \quad \text{Equation 12}$$

The $dS_c<0$ step is associated with a energy generation process, $d\epsilon>0$ ($d\epsilon$ is referred to as dQ in marcroscopic systems), this is what is usually considered the pulse energy. It is the transmitting "antenna" that transmits an energy pulse which is received by the $dS_c>0$ which is paired with a $d\epsilon<0$.

FIG. 11 illustrates in item group 1100 the various differential entropy, energy and internal energy features described above. The paired events, are labeled D for the −dS event and AD for the +dS event. On FIG. 11, event part 1101, which had many degrees of freedom, moves towards according the arrow shown and condenses with event part 1102 which is fixed and causes a wave shown as element 1105 to proceed toward paired event, where event part 1104 leaves event part 1103 according to the arrow shown and 1104 gains degrees of entropic freedom. Example embodiments and materials of these event parts are provided in later sections of this document. Here the general thermodynamic expressions of exothermic condensation with negative entropy change and endothermic anti-condensation with entropy expansion are used to represent one of many physical situations. Indicated on the Figure is the change in the differential docking (D) internal energy and the change in the antidocking (AD) internal energy are equal.

Including, as a few examples without limiting the claims in scope, the absorption of a photon in an element, molecule, nano-particle or quantum dot that causes an electron to increase in entropy by gaining additional degrees of freedom or the emission of a photon by an element, molecule, nano-particle or quantum dot to provide energy but in turn have an electron decrease in entropy. In this document such paired events may be called condensing and anti-condensing, or reversible association and dissociation, or binding and anti-binding or docking and anti-docking. Further specific molecular examples are provided in the next section.

The events are simultaneous and with internal energy equal and opposite. For event D to transpire it must be thermodynamically, simultaneously paired with event AD. Event AD requires energy and provides entropy. Event D provides energy and requires entropy.

Pairing {−dS with −dϵ}, {−dS with +dϵ} and {+dS with −dϵ} are all non-viable (a single entropy loss event will not take place and a single event vacuous of energy cannot proceed without input), but the domain of {+dS with +dϵ} can exist.

A thermodynamic analysis of TEM waves from the point of view of population of states and number of states is instructive for quantifying the above outlined thermodynamic process and practical nanoscale engineering operations.

A fundamental equation in Statistical Thermodynamics [Donald A. McQuarrie, Statistical Thermodynamics, University Science Books, 1973] shows the energy or heat (dϵ or dQ) as MdP terms, where M is the number of states and P is the population of states and a term PdM which is analogous to the continuum thermodynamic term for work (dW) and dU is the internal energy at constant moles.

$$d\overline{U} = \sum_j M_j dP_j + \sum_j P_j dM_j \qquad \text{Equation 13}$$

The transference of energy and entropy between the $dS_c>0$ and $dS_c<0$ event pair generates a wave of "heat", dQ (or dϵ, as a more appropriate term at the nanoscale), and work, dW (which contains the entropy term), which are analogous to the electro and magnetic parts of a TEM wave. The System's overall change in internal energy is zero, but dQ and dW are not state functions, they depend on the path. The wave represents all such dQ, dW paths such that the System always has constant internal energy. This generates the characteristic multi-values for the electro and magnetic parts of the TEM wave that are equal in magnitude but orthogonal vectors. The backwards-travelling wave is also maintaining constant internal energy with the forward traveling wave.

The cellular array may be isothermal (constant temperature) since changes in temperature may absorb or emit energy, yet it can not do so in instantaneous quanta, but TEM waves may.

The system definition differs from typical engineering systems which are usually based on drawing a box around an event in space; the system definition of this analysis is based on a field of energy and entropy quantum that take place within a constant second derivative of Internal Energy domain. Similar system definitions have been discussed throughout the literature including by Audretsch [Entangled World, Juergen Audretsch, Wiley-VCH, 2002].

The conformational entropy change dS for a given event pair, has more than one term, i.e., more than one loss in system states. The event pair forms transfer a multitude of states, $M_j$, originating from the entropy positive dissociation event, and generates a set of a multitude of populations of states, $P_j$, originating from the energy positive binding event.

Equation 14 is the simplest description from Equations 11 and 13 where Subscripts 1 of Equation 14 represents condensing events and Subscripts 2 represent dissociation.

$$M_{j1}dP_{j1} - P_{j1}dM_{j1} = M_{j2}dP_{j2} - P_{j2}dM_{j2} \qquad \text{Equation 14}$$

When viewing the wave from the number of states at dS<0 Event, $M_1$, and dS>0 Event, $M_2$ and the population of states at dS<0 Event, $P_1$ and dS>0 Event, $P_2$, wave Equation 15 comes about from Equation 14 and the other preceding equations.

$$\left[\left(\frac{\partial^2 M_1}{\partial P_2^2}\right)_{M_2} - \left(\frac{dM}{dP}\right)^2 \left(\frac{\partial^2 M_1}{\partial M_2^2}\right)_{P_2}\right] = 0 \qquad \text{Equation 15}$$

The wave has a wave "velocity" shown in Equation 15, where dM is the differential change in number of states, dP is the differential change in the population of states.

The change in normalized number of states divided by the change in normalized population in states is equivalent to:

$$\left(\frac{dM}{dP}\right)^2 = \frac{(M_2)_{M2}}{(P_2)_{P2}} = \frac{\mu_o \in_o}{\mu \in} = \beta^2 \qquad \text{Equation 16}$$

Where $\beta^2$ is the square of the wave velocity over the speed of light $(\upsilon/c)^2$ or the inverse square of the Index of Refraction $(\mu^{-2})$ and $\in_o$ and $\mu_o$ are the isotropic Permittivity of Free Space and the Permeability of Free Space, respectively, while $\in$ and $\mu$ that are the actual values for the material in which the TEM wave is propagating. On occasion in this document the symbol $\mu$ is used to describe, micro, as in micro meter ($10^{-6}$ m) or Index of Refraction, but the meaning in each case is clear from the context.

Equations L.E.N.A. may be derived from the preceding equations where, $\overline{P}^2$ is the population of states density and θ is the same as that introduced in the preceding section to express P and M in radial coordinates in Complex Numbers.

$$\overline{P}^2 = \left[1 - \frac{1}{\beta^2} + \frac{\sin^2\theta}{\beta^2}\right] \quad \text{Equation L.E.N.A}$$

If, $$\theta = \pm \text{ATan} \pm \sqrt{4n^2 + 4n + 1}$$

At $$\beta^2 = 1$$

$$\overline{P}_n^2 = \sin^2\left[\pm \text{ATan} \pm \sqrt{4n^2 + 4n + 1}\right] \quad \text{Equation T.P.}$$

Equation T.P. suggests that the customary way that light waves are represented as continuous electro and magnetic vectors under a Sine curve may not be the case for newly initiated spherical pulses. Rather Equation T.P. indicates that for the first complete wave there may be quantized vectors that start at only one line at $\pi/4$ and another in the opposite direction at $3\pi/4$, then the second wave may have two more lines, and so forth until when the wave has a planar front, there is essentially a continuous number of vectors for the electro and magnetic parts of the wave, under a Sine and or Cosine curve.

At $n=-\frac{1}{2}$, $\overline{P}^2=0$. For 6C4 cell arrangements, this corresponds to ¼ of the volume of the first cell. Table 2 provides representative examples of the results for Equation L.E.N.A. at $\beta^2=1$.

TABLE 2

Some Initial Terms for $\beta^2 = 1$

| | | | | | | |
|---|---|---|---|---|---|---|
| A | Wavelength Count | 1 | 2 | 3 | 4 | 5 |
| B | $\vec{n}$ | 0 | 1 | 2 | 3 | 4 |
| C | $\overline{P}_n^2$ | $\frac{1^2}{2}$ | $\frac{3^2}{10}$ | $\frac{5^2}{26}$ | $\frac{7^2}{50}$ | $\frac{9^2}{82}$ |
| D | $\frac{\Delta P^2}{\Delta m_s}$ | | $\frac{8}{8}$ | $\frac{16}{16}$ | $\frac{24}{24}$ | $\frac{32}{32}$ |

Table 2 shows the population of states approaching 1 and that the change in population of states divided by the change in states is constant (row D of Table 2), and 1.

In the preceding section, Equation 6, which assumes that the Index of Refraction is near 1 and the wavelength size, $\lambda$, and cell width size are similar showed the imaginary part of $\vec{n}$ is zero (0) at a half waveperiod and a pulse volume of ¼ (pulse volume normalized to the volume of 1 $\lambda$ as described previously related to Equation 1). The real part of $\vec{n}$ remains constant and after the first half waveperiod only the Im part of $\vec{n}$ grows. Equation 6 shows that as the sphere grows, i.e. $m_c$ increases the Im part of $\vec{n}$ converts to a real number. There is a mathematical inflection at the first half wavelength. Equation 7 and Equation Set 6B indicate that 6 is zero at a pulse volume of ¼. Equation L.E.N.A and Equation T.P. also shows that the population of states at this pulse ¼ volume is also zero (0). When there is no population of states, there is likely no population to transfer.

However, if a pulse that could not undergo intra-cellular energy transactions was to have its wavelength shorten by an increase in Index of Refraction in a new cell, for example, the right Index of Refraction to exactly half the wavelength, then a pulse in such a situation would be able to obtain n=1 within said cell of higher Index of Refraction, thus be able to undergo a second type of intra-cellular energy transaction, one that is induced by converting a single cell, which was $\lambda$=width=length=height to become $2x\lambda$=w=h=L where x are the integers 1, 2, 3 . . . .

The array designer therefore has a method to induce intra-cellular energy transactions. The wavelength can be pushed to half or a quarter or other multiples of its original length, which would allow it to reach n=1 or n=2 or other multiples of n, within a cell that was sized for a pulse that is twice or four times or other multiples of the Index of Refraction caused shorter wavelength. This will be further illustrated in the next section.

Throughout this document the focus has been on the initiation of a pulse, with emphasis on a TEM pulse. The term "newly initiated", "initiation" and "early stage" describe a similar physical situation that the pulse comes into existence at fractions of a full wavelength $\lambda$ (newly initiated) and then grows to 1, 2 or a few wavelengths (early stage), thus remaining a non-planar wavefront. Except in the case where the pulses are intentionally allowed to grow in order to record their positions and the corresponding primes and semi primes with array position for large n during prime factorization algorithms.

This newly initiated pulse offers many possibilities. In one example possibility, by positioning the new initiation of two pulses near each other appropriately, the two pulses may sum. The arrangement must be such that the angular momentum and linear momentum of each arising pulse can balance as would the photon of twice the energy would. The twin pulses each of half the energy of the composite pulse must be induced to arise simultaneously for the summation to take place. The way to have them arise simultaneously is again to have negative entropy events matched.

$$dU_{Neg.dS\ event\ 1} + dU_{Neg.dS\ event\ 2} = dU_{Pos.dS\ Event}$$

Where the dU negative events are twin events. The entropy required by the twin half energy events is the same as the entropy provided by the entropy requiring event. The twin entropy negative events provide the energy for the entropy positive energy negative event.

It is known that the output of an infrared laser may be converted into the visible range using the second harmonic generation technique. The notion has been engineered to take place for well-developed waves, but the prior art does not before now, describe photon summing for early stage spherical waves. For example, it is know in the industry that the 1064 nm emissions from Nd:YAG laser are converted to 532 nm by passage through the nonlinear material KTP. Allen and Padgett describe [Contemporary Physics, 2000, volume 41, number 5, pages 275-285] using second harmonic generation where two photons combine to form one photon with twice the energy that is double the frequency and twice the orbital angular momentum.

In the case of the early stage spherical TEM pulses, initial summing of 2 photons of lower energy to generate 1 photon of higher energy may be one of several tools, a useful method, for constructing a new type of computer microprocessor, with particular application to producing pulse signatures to represent information. The term "signature" is used since unique series of integers can be generated to represent pieces of information. Second harmonic generation using well-developed waves differs from spherical pulse twinning photons, since the later may take place without using a Frequency Doubling Crystal.

Pulse series of particular signatures to represent information will be explained in more detail in the foregoing section. The basic premise is to introduce various photons into an octahedron array of cells/micro-cubes at specific symmetry locations, such as the two axial and four equatorial apices of an octahedron of cells. And some or all of the photons that are allowed to enter in the same location, will also have the ability to twin and undergo two-photon absorption by a receiver/re-transmitter. The symmetry of the array combined with strategic twining capability will enable, when the output of the particles in said array-box are finally READ, production of a series of numbers that are uniquely a function of the start symmetry and twining function.

Numerical findings to highlight and further describe the application to building a device are: (1) no intra-cellular energy transfer at less than the first half wavelength as a tool to induce captive intra-cellular energy transfer using Index of Refraction increase as a method to make pulse-based capacitors and pulse-based series logic gates; (2) photon doubling for generating signature logic; and (3) the newly found inherent primes and semi-prime generators in the cellular arrays described herein, which is a property that may be used to do prime factorization with an unexpectedly small number of algorithm steps.

Using Index of Refraction increase to build capacitance and gates will be described in the next section.

There are at least two nano-engineering implications that TEM pulses are not transferred when receiver and emitter are closer than λ/2: (1) an extremely large number of TEM pulses of various wavelengths can be radiated by attached antenna-like transmitter/receivers within the same cell locations yet remain uncoupled and (2) TEM pulse capacitor-like and transistor-like structures can be built at the nano and micron scale. The calculation of λ/2 depends on which energy photon is under consideration. When multi various photons are generated in the same space, the transmitter absorber/re-transmitters must each individually be appropriately spaced. This numerical result provides a method at the nano- and micro-scale for engineering super parallel logic gates, at a degree of practical parallelism not described in the prior art.

This half wavelength indication implies that antenna-like transmitters and receivers placed within a cell can be set up at distances greater than ½ wavelength for intra-cellular processes, but less than ½ wavelength to force energy transactions to be inter-cellular.

Considering again the half wavelength indication: assume the limit to the number of parallel wavelengths of light pulses transversing the same three-dimensional cell array is the wavelength measuring resolution of the final pulses of energy. As one example to illustrate this point, using photon pulse emitters in wavelengths in the range of 48 nm to 20 microns at 20 nm resolution may allow for 1,000 parallel operations happening in the same cells.

If emitters and absorbers are placed in the same cell with intra-cellular inhibition. If two 50 nm wavelengths can in combination be absorbed by a 100 nm receiver, then the choices are to not have a 100 nm receiver in the same cell or have it placed closer than 25 nm away to inhibit interaction of the said two 50 nm TEMs.

Despite the proposed high degree of parallel travel of many wavelengths, even with all that traffic in the same three dimensional stack of cells at the same time, there will be negligible heat generation—whereas electric current based transistors could not use the same transistors at the same time 1,000 times.

Equation L.E.N.A. was derived for a generalized $\beta^2$ but so far the description has been focused on $\beta^2=1$. An expression for the change in entropy of the wave pulse with n level will assist in engineering the system and materials for guiding the pulse through transistors that utilize newly initiated spherical wave pulses. It is useful to look at Equation L.E.N.A. for $\beta^2<1$ and to quantify the change in entropy to discern useful $\beta^2$ i.e. inverse square Index of Refraction.

$$\pm\sqrt{\frac{1}{\beta^2}} = \mu \qquad \text{Equation 17}$$

It is desirable to have an equation that provides a trend or exact value for the entropy of a TEM pulse wave as a function of $\vec{n}$, and since these events are by quanta, accurate equations would likely be based on integers and their transformations, yet such an equation is not generally in the prior art before now.

First examples of terms for Equation L.E.N.A. for $\mu^2=2$ are shown in Table 3.

$$\text{For: } \beta^2 = \frac{1}{2} \qquad \text{Equation 18}$$

$$\vec{P}^2 = -[1 - 2\sin^2\theta]$$

$$\vec{P}^2 = -\cos 2[-\text{ATan} \pm \sqrt{4n^2 + 4n + 1}] \qquad \text{Equation 19}$$

$$\vec{M}^2 = \sin^2[-\text{ATan} \pm \sqrt{4n^2 + 4n + 1}] \qquad \text{Equation 20}$$

TABLE 3

Some Initial Terms for $\beta^2 = 1/2$
For: $\beta^2 = \frac{1}{2}$

| | | | | | | |
|---|---|---|---|---|---|---|
| A | Equivalent, $\beta^2 = 1$, wavelength | 1 | 2 | 3 | 4 | 5 |
| B | $\vec{n}$ | 0 | 1 | 2 | 3 | 4 |
| C | $\vec{P}^2$ | 0 | $\frac{8}{10}$ | $\frac{12}{13}$ | $\frac{24}{25}$ | $\frac{40}{41}$ |
| D | $\vec{M}^2$ | $\frac{1}{2}$ | $\frac{9}{10}$ | $\frac{25}{26}$ | $\frac{49}{50}$ | $\frac{81}{82}$ |

From the equations provided in this document, $d\epsilon|_n^{n+1}=MdP$ and $dw|_n^{n+1}=PdM$ can be calculated along with the entropy difference between n levels of States. It can be shown that thermodynamic calculations fits to the power law relationship within the data shown in Table 4.

TABLE 4

Examples of First 4 Integer Power Terms

Equation 18

$$\left[\frac{\vec{P}^2|_{n+1}}{\vec{P}^2|_n}\right]^{-\frac{\vec{P}^2|_{n+1}}{2}} = \left[\frac{\vec{M}^2|_{n+1}}{\vec{M}^2|_n}\right]$$

$$\left[\frac{\vec{P}^2|_{n=2}}{\vec{P}^2|_{n=1}}\right]^{-\frac{\vec{P}^2|_{n=2}}{2}} = \left[\frac{\vec{M}^2|_{n=2}}{\vec{M}^2|_{n=1}}\right] \qquad \left[\frac{\frac{12}{13}}{\frac{8}{10}}\right]^{\frac{12}{26}} = \left[\frac{\frac{25}{26}}{\frac{9}{10}}\right]$$

TABLE 4-continued

Examples of First 4 Integer Power Terms $$\left[\frac{\bar{P}^2\big|_{n=3}}{\bar{P}^2\big|_{n=2}}\right]^{\bar{P}^2\big|_{n=3}} = \left[\frac{\bar{M}^2\big|_{n=3}}{\bar{M}^2\big|_{n=2}}\right] \qquad \left[\frac{\frac{24}{25}}{\frac{12}{13}}\right]^{\frac{24}{50}} = \left[\frac{\frac{49}{50}}{\frac{25}{26}}\right]$$

$$\left[\frac{\bar{P}^2\big|_{n=4}}{\bar{P}^2\big|_{n=3}}\right]^{\bar{P}^2\big|_{n=4}} = \left[\frac{\bar{M}^2\big|_{n=4}}{\bar{M}^2\big|_{n=3}}\right] \qquad \left[\frac{\frac{40}{41}}{\frac{24}{25}}\right]^{\frac{40}{82}} = \left[\frac{\frac{81}{82}}{\frac{49}{50}}\right]$$

$$\left[\frac{\bar{P}^2\big|_{n=5}}{\bar{P}^2\big|_{n=4}}\right]^{\bar{P}^2\big|_{n=5}} = \left[\frac{\bar{M}^2\big|_{n=5}}{\bar{M}^2\big|_{n=4}}\right] \qquad \left[\frac{\frac{60}{61}}{\frac{40}{41}}\right]^{\frac{60}{122}} = \left[\frac{\frac{121}{122}}{\frac{81}{82}}\right]$$

It can be shown that between States of the outgoing wave pulse the entropy increases for $\beta^2<1$, i.e. $\Delta S\big|_n^{n+1}>0$, while the backwards and forwarding traveling wave sums each of these thermodynamic terms $\Delta U^T\big|_n^{n+1}$, $\Delta S^T\big|_n^{n+1}$, $\Delta \epsilon^T\big|_n^{n+1}$ and $\Delta w^T\big|_n^{n+1}$ (where superscript T indicates total of forward and backward traveling wave) to zero.

The type of energy transfer from the pulse initiation to pulse acceptor changes as a function of $\beta^2$ where at $\beta^2=1$ it behaves as an "isothermal" transfer, for $1>\beta>0$ it behaves as a polytropic energy and work transfer and the limit as $\beta^2$ goes to 0 (i.e. the Refractive Index goes to infinity) the process is adiabatic, meaning there is no population of states transfer.

The integer thermodynamic relationships are rich in information and allow for making accurate algorithms for many types of calculations, involving prime factorization, raising numbers to a power and most any type of mathematical function, often more accurately since each rational number is arrived at through combination of integers. The numerical system itself used within the algorithms of the integer based computer would show benefit if it is based on integer thermodynamic parameters of TEM spherical pulses itself. This type of advantage is not available in electron-based computing.

Equation L.E.N.A. has a special case due to the trigonometric double angle equations at $\beta^2=0.5$ (i.e. $\mu=\sqrt{2}$). Refractive index of $\sqrt{2}=1.4142$, is similar to the refractive index measure for human cells, for example, 1.41 at 1310 nm wavelength for human dermis cells, 1.445 Human skin cells Type V, 1.37 [Phys. Med Biol. 51 (2006) 1479-1489]]. This is an unlikely coincidence and it suggests the inter-cellular mechanisms for known far infrared processes, such as wound healing. Index of Refraction changes, one example of several being increase in of $\mu^2=1.001$ to $\mu^2=1.41$, may be used to guide TEM spherical pulse waves through the cellular arrays.

Two ways for representing and processing information focused on in this work are: (1) TEM pulses introduced into and moving within a restrained architecture of cells according to thermodynamic rules elucidated, which may direct the pulses to form signature patterns. Or light pulses moving within three dimensional arrays of cells may represent and process information (2) by TEM pulses moving according to principles of operation derived from the computational experimental results herein in an determined manner through light-based Logic Gates, such as AND, OR, NAND, NOR, NOT, XOR, XNOR. Such Logic Gates are described in the next sections.

Pattern generation within cells based on a set of underlying rules is sometimes referred to as Cellular Automata, but the groups of wavelengths that form patterns described herein modify the common notion of Cellular Automata in order to generate restrained and readable signature patterns.

In a previous section of this document the Oh symmetry of the cellular array arrangement was introduced. Consider now the integer equation introduced in Table 3 where the population of states density is $\bar{P}^2=\cos 2\theta$ a double angle i function for $\beta^2=\frac{1}{2}$. This function has a shape like the $dx^2-y^2$ orbital for D-electron Octahedron transition metal-ligand complexes. FIG. 12 shows the four-leave rose shape of the double-angle function similar to that of the integer population of states equation. (On FIG. 12 the graph follows along the x axis and y axis, while the z axis coming into and out of the page, is not shown.) In this sense the photon looks like a tiny particle with very large orbitals that stretch out in a similar manner to D-electron transition metals. When the bonding "orbital" of the out-going photon associated with the forward wave contacts the anti-bonding orbital of the backwards moving wave then the negative and positive, work and energy terms from the forward and backward traveling wave meet in the same n level and the energy and entropy is transferred in quanta between the paired events (dS>0 and dS<0).

Light-Based Logic Gates Series:

Intra-cellular pulse capacitance can be induced by using two methods: (1) the Index of Refraction is lowered in one cell compared with its neighbors, and (2) the cell with the lowered Index of Refraction also has three antenna-like sites for engaging in intra-cellular pulse transfer.

Consider the anti-condensing process shown in Equation 21. Here two molecules, elements, transition metal complexes, nanoparticles, quantum dots, pharmaceutical style docking site with drug-like molecule may be reversibly associated as |LK where |L is a stationary site and K is capable of mobility, either a photon itself, or molecule or any of the types indicated in the previous sentences. The line "|" in front of the "L" indicates the "L" is tethered or stationary in some way. A quantum of energy, $\epsilon$, can dislodge K from |LK. The process requires energy, and more details about example chemistry are provided in this document in a later section. Further the reversible process where K associates with |L can happen and emit energy, $\epsilon$. If a cell has a starting point of three such sites, where two are in state |LK and one is in state |L+K (free), then this tri-combined set of intra-cellular antenna has the capacity to absorb two quanta of energy, $\epsilon$, before they would need to bump-on any further energy to be discussed about FIG. 13.

$\epsilon + |LK \leftrightarrow |L+K(\text{free})$      Equation 21

Two in combined state |LK, ready to absorb energy $\epsilon$ and increase entropy and one in uncombined state |L+K. In the next section regarding materials, L and K may be embodied as the Lock and Key molecules usually associated with pharmaceutical docking and anti-docking (dissociation) processes. The equation for energy absorption can happen twice, as shown in the chemical equation format:

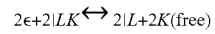

$2\epsilon + 2|LK \leftrightarrow 2|L+2K(\text{free})$

FIG. 16 shows this schematically within item group 1700 within a cell, where K can be in two states, reversibly bound to |L or with high degree of freedom of motion. And the small boxes represent the fixed |L and the rectangle around the group represents a cell. Usually the index of refraction would be reduced in all cell containing extra antenna-like sites, since the goal in adding extra sites is to induce intra cellular transactions until a condition is met. The condition depicted in FIG. 16 is that two identical pulses, ϵ, must be absorbed in the cell before it will be able to retransmit the pulse.

More details about FIG. 16 are, in the first cell the 2|LK and L+K group is in dynamic equilibrium so that when the one free K docks to an |L the energy it produces causes an intra-cellular dissociation of one of the |LK pairs. The cells depicted should be viewed from left to right to indicate new steps in the process. These steps proceeds from left to right (1701 to 1701A to 1701B) and then below (to the "Inter" two cell group, 1701C). The below images (1701C) shows the addition of a new cell that accepts a pulse when inter-cellular transactions become allowed.

In the second step (1701A) a pulse energy, ϵ, enters the cell but is absorbed by a, |L and K dissociation. In the third cell (1701B) when another photon of energy exactly the same energy, ϵ, is added to the cell, it creates a photon saturation that when any of the K's associates with any of the L's the energy generated must be transferred inter-cellular, since there is no absorption capacity remaining.

FIG. 17 shows a schematic representation of a TEM pulse transistor mechanism. It is meant as an example, and not an exhaustive description of methods to build TEM pulse based transistors from the information provided herein.

FIG. 17 shows in item group 1710, entering cell 1712 Signal S' at the left which is meant to travel towards the gate in the center of the diagram. The center gate of the diagram has similar features as element 1701 in FIG. 16 including the ability to absorb one ϵ before allowing inter-cellular energy transactions. Signal S" is a second signal that may enter at cell 1713. 1714 and 1715 indicates the cell attached to the center cell 1701 that leads to other operations and READ and the cell attached to the center cell 1701 that leads to reflective path or annihilation. When both S' and S" are present pulse of energy is able to pass the gate cell in the center (C). The gate cell in the center (1701) has a higher Index of Refraction, thus a lower, $\beta^2$, indicated on the diagram as $\beta^2-$. All the other cells have $\beta^2+$, which is the same as having a lower Index of refraction. The Index of Refraction difference between the center gate cell and the other cells around it is constructed to enable the λ of the wave in the center cell to be ½ the wavelength of the pulse in the surrounding cells. This differential in Index of Refraction is just one example, and other combinations of Index of Refraction are possible.

If both S' and S" are present, there is a signal that may be in the form of a photon that may be sent to O→R. If only S' or only S" are present then either of those photons remain in capacitance in cell 1701.

The center gate cell also has three antenna-like sites, two (indicated by the number 2 in FIG. 17 near point C) at the center and one depicted by the dot at the right wall of the center cell (the dot near the notation "E"). These three intra-cellular energy transfer sites are like those found in FIG. 16 (cell indicated by diagram element number 1701).

A pulse travels from S' to one of the antenna-like sites in the center cell, either C or E. That pulse gets stuck there in the center cell because intra-cellular transactions between the center antennas (C) in the center cell and the right side antenna (E) of the center cell prevail since they require 1 wave-period only. Since the Index of Refraction has been increased, there is a n=1 intracellular transaction between those two antenna despite the shorter distance.

In principle, a pulse travelling out from the right hand side E antenna of the center cell could go towards A but a movable reflective surface, marked 1711 on FIG. 17, awaits at the end of the cell train that goes to A. Reflective surface 1711 makes the entire cell train going towards A, futile, so that all the cells are degenerate in that train and pulses can travel back and forth along the train to A. No particular time is lost, since the transactions are fast.

As FIG. 13 describes in the group of items in 1300 pulse reversibility. This feature that the cell train pulse can travel reversibly when the cell train is symmetric, unless there is some other event, such as ultimate annihilation of the photon, to make the travel direction asymmetric.

This first photon (S') alone in the center cell would in all probability not travel up to O and R since it would encounter the intra-cellular antenna sites at n=1 inside the center cell first but need to reach n=1.5 or n=2 as shown in FIG. 17 to make it to the direction of 0 and R. The dots in cells 1714, 1701, 1712, 1713 and 1715 indicate locations that an antenna-like site is located for the absorption or transmission of a pulse.

A second pulse may or may not come from S" into 1701. If a second pulse comes than an AND situation is present. The second pulse from S" would require the pulse trapped in the intra-cellular energy transactions to engage in an inter-cellular energy transaction since the gate capacitor (the center cell, diagram element 1701) would be saturated in its ability to absorb pulse, in a similar way as described in FIG. 16.

The pulse leaving the center cell would not undergo net movement towards A, since there still is a reflective surface in the way. The introduction points of S' and S" in the cell train before cell 1712 and 1713 would not offer any way out for the photon as well. If it traveled those ways, it would return periodically to the center cell which would reject it. The pulse could travel up towards O which indicates other processes, such as other logic gates and then to R which indicates READ.

READ processes would entail annihilation of the photon. Once it goes in that "O→R" direction, it will never come back.

After the photon is annihilated by the READ process, the S" photon still trapped in the center cell can be cleared. It can be cleared since after the photon is read, a Feed Back process will tell the reflective surface to allow direction A by temporary removal of the reflective surface at 1711. 1711 will be opened after the photon is READ. The A stands for photon annihilation. Annihilation can be of many types, including a mini-chemical process that uses photons in a chemical reaction to produce anything harmless or a semi-conductor device to convert photons to electrons, or other methods.

The description just provided around the functioning of FIG. 17 is an AND gate. Here both S' and S" must have signal for there to be anything READ. Instead of at least three energy inputs such as is often found in electric current based AND gates, in the TEM pulse AND gate just described only the two S' and S" in question, need be presented. The question is asked is both S' and S" present and the answer in the form of a photon signal is generated for reading.

It is possible to also construct TEM pulse based gates that use three energy inputs as well, but two is simpler.

Another example to mention is when the Index of Refraction of the center gate cell causes the pulse wave in the center cell to be ¼λ.

FIG. 18 elaborated in item group 1720A and 1720 B shows a capacitor designated by 1720 B capable of absorbing 1 ϵ but composed of 2 cells. The Index of Refraction in these two capacitor cells is such that the wavelength decreases to λ/4. Cell 1721 and 1722 represent one form that the capacitor can assume and cells 1723 and 1724 represent another equivalent form. The cell marked C can absorb one ϵ but the box marked F would cause a pulse to flow either to the box marked C or intercellular. However, since the Index of Refraction is such that the dual cell capacitor has λ/4, the time to intra-cellular energy transfer is only 1 Tau whereas the time to inter-cellular transaction is 3 Tau, therefore intra-cellular transactions are more likely with one ϵ input.

Referring to the group of cells labeled 1720A. Cells 1721, 1722, 1723 and 1724 are the same as described in the previous paragraph. 1711 has been described in item group 1710, previously. There are three antenna-like sites in each cell of this dual cell capacitor. Those antenna-like sites are positioned in between the dual capacitor cells and away from the surrounding cells. The surrounding cells have low index of refraction whereas the dual cell capacitor has high index of refraction as mentioned to cause λ/4 in the capacitor and λ in the other cells.

Energy transactions outside of the capacitor require 3 wave periods (3 Tau), whereas intercellular transactions only require 1 Tau. Only if the capacitor is saturated will a pulse move intercellular to O→R or S' or S". But S' and S" offer no place to go and the pulse will return as to the capacitor until it goes toward O→R. At R the photon is READ and annihilated.

Direction A goes in the z dimension, out of the page, to A. As was described in FIG. 17, using reflective surface 1711 to block this direction until the photon is READ and a Feed Back signal is sent to open the reflective wall at 1711 thus allowing the photon left in capacitance to leave the system to annihilation.

The AND logic gates described have cascadable properties. The signal, represented by the photon that passes the gate, is unchanged in magnitude or in any way by passing the gate. The photon that passes the gate can then pass through further gates of similar type or not.

Linear series logic gates, in analogy to the type used in electric current based computing would use at least one photon pulse to assist another pulse or multiple pulses to pass through a gate. For example, for an OR gate, two pulses may cause a pulse based OR gate to provide a positive signal (a photon to read). The principles used in the above AND gate example can be used for the OR gate and all the other logic gates usually employed to create CPU processes.

Other methods to create gates using TEM pulses may include: (1) A controlling input pulse can disrupt the ability of the receiver/retransmitter from absorbing pulses. From a generalize chemical physics understanding, the site that absorbs the pulse would have its molecular structure altered by an input pulse, rendering the site incapable of hosting a 1ϵ energy pulse. In another example (2) two signals of 1ϵ energy must perform a two photon absorption at a site that requires 2ϵ energy. And (3) by the photon capacitor method described in the preceding paragraph.

By a couple of methods, TEM pulses can be induced to move irreversibly through the cellular array. The first technique is simply, although forward and backward motion of the pulse is often of equal probability, the action of READ of the photon will extinguish the photon, ultimately making the reversible direction non-viable.

Photon sinks come in many forms and may be used to cause irreversibility along with the other techniques mentioned. Chemical sinks can be used in which some minor chemical reaction absorbs a photon.

There are at least two ways that photons which proceed through the needed logic gates can be added together, if required. (1) Photons can be added in specific quanta to other photons by combining at an antenna-like receiver that requires exact multiples of the photon's energy. (2) Photons can be added by introducing them irreversibly into a group of cells that constitute a "photon in a box" principle. In this method the wave pulse is essentially trapped in a series of cells, forming what appears like a standing wave. The photons can be retrieved when a "valve" is opened to let them escape and usually proceed towards being READ.

The "valve" can be constructed in one of several ways. In one way, photons can only leave the "particle in a box" when they are added to by an external source of "valve-turning" photons.

Ultimately READ of the photon output can be done in several ways. In one way, the photon can be used to control a routing unit operation, for amplification. In such a routing unit operation, a planar wave containing significant intensity for READ signal can have its angle slightly altered so as to be redirected by the photon that made it through the gates to a Detector, which is usually a photodiode that converts light to electron flow. The redirection can be triggered by a single photon or a group of photons. Researchers have reported single photon transistor gate keepers. Those methods can be used, or simple altering of the reflective properties by the photon may be enough to redirect the planar TEM beam. The mechanism for changing the reflective properties should be reversible so that the planar beam is only momentarily altered in it angle in order to record signal.

The technique just described for amplifying the existence of the photon that makes it through one or many logic gates can also be used for all optical routing where the planar wave constitutes multiple wavelengths containing large amounts of useful data. This differs from the example of the preceding paragraph, where the planar wave was only a proxy for amplifying the photon's existence enough to measured. In optical routing the planar waves content is of value and the photon can be generated by a series of logic gates executing an algorithm that allows the information in the planar wave to be routed for any further number of processes, for example, to arrive to a location where the wavelengths of the planar-wave bearing information in various wave-packets are separated according to wavelength or any other criteria or READ or separated and read, or discarded in part, direct signal to ports, etc. . . . . .

By a series or parallel light-pulse based routers the incoming valuable planar wave of information can undergo several processes controlled by the photon pulses of the microprocessor of the inventions described herein. An all-optical-router using TEM pulse based microprocessor of this document may be used to provide a photon or a group of photon signals to direct a composite plane wave. In this example, if the AND gate is satisfied, one outgoing photon can undergo asymmetric index of refraction boost while another outgoing photon, or group of pulsed photons may proceed to the routing unit where it alters the planar wave direction (deflects) just enough to be READ, whereas without the photon introduction the planar wave filled with information would not be deflected to be READ. Deflection of an information carrying group of planar waves by one or some small numbers of photons can be used several times in series to continue to direct the planar wave to various ports or any of several operations that need to be performed on the information.

Using the principles described herein, all the familiar logic gates of classical computers can be designed in analogy based on TEM spherical-pulses hopping from cell-to-cell.

Optical computing equipment described in the literature are based on developed plane waves and often use small-scale reflective surfaces and reflective layers of materials. In such previous arrangements, a substantial energy source is required to generate the focused plane waves and the light used is at an unknown number of wavelengths from its inception. When light is divorced from its number of periods from inception, a large amount of useful information in the light wave is lost. In the preceding sections, the usefulness of keeping count of the number of wavelengths that have transpired since pulse inception was introduced, which includes but not limited to utilizing integer equations based on n has been described. The count of n can be known since it corresponds to a location in the cellular array, which can be known.

As opposed to plane-wave reflective optics, newly initiated pulses of light maintain connection to their inception-to-current-wave period. That period count contains a wealth of information, including a series of useful primes and semi-primes that are quantified in the integer functions that are obtained by computational experimentation. This prime and semiprime information enable a large number of traditionally difficult computations easy and fast, since the prime count is inherent to the pulse property.

Pulses may be induced to hop from transmitter to absorber/re-transmitter from cell-to-cell, in a spherical-pulse-to-spherical-pulse fashion. This is important because the computational experimental results provide methods for pulse control, including but not limited to, allowing or disallowing a pulse to move in a particular direction by use of second pulse, or providing the driving force for pulse determined-moving by increased index of refraction cell-to-cell pathways.

Signature Patterns:

First consider a train of cells shown in FIG. 13. Each cell has a transmitter-receiver/re-transmitter at the center in this example. If energy is added to the first cell, a bump-on effect is created that the energy will be transferred in the train of cells. FIG. 13 shows in a two dimensional schematic cell antenna-like sites producing pulses indicated by the circles extended in all directions one wavelength, $\lambda$. Consider for example energy, hv, or hc/$\lambda$, intentionally added at the first cell marked 1300, causing an anti-condensation event. Cell 1300 can revert by random motion so that the energy $\epsilon$ that was absorbed as shown in the equation below the cells is emitted as L and K re-condense. Upon re-condensing a new pulse 0 travels in all directions until it encounters antenna-like site 1. The device is designed so that no other antenna-like sites are encountered in other directions. Upon absorption of energy $\epsilon$, antenna-like site 1 can likewise emit pulse 1301, but in this case the pulse can either return to cell 1300 or proceed to antenna-like site 2. 1302 and 1303 represent that there can be additional cells that facilitate pulses along the cell train and item 3 is another location in a cell where energy is absorbed and retransmitted.

The cells in the train are degenerate, so some event must be added at the end of the train to cause the photon to move forward. There are several such possible events. Examples include: (1) the photon is eventually annihilated in some process, chemical or electric; (2) the photon is annihilated during the process of reading the photonic energy after the photon proceeds through many logic gates; (3) the photon is brought out of phase with the earlier train of cells by a sudden change of Index of Refraction, along with a change of location of the antenna-like receiver/re-transmitters.

The pulses may be intentionally trapped if no photon annihilation by conversion to electrons or other means is provided in which case or if the train is blocked on both sides and the photon $\lambda$ matches the cell dimensions or is the proper multiple of the array dimensions it will create a kind of standing wave particle in a box. Photon pulses may be induced to hop from cell-to-cell or be paused, as needed.

Applying now in example, photon twinning and two photon absorption, consider a 9× array of three dimensional cells. Within each three-dimensional cell an ensemble of transmitters-absorber/re-transmitters are attached to the cell wall. A train of cells lead to each apices of the octahedron that comprise the octahedron embedded in the 27 cell cube. FIG. 14 shows item group 1400 where a 27 cell cube with 4 cell trains leading in and out of the 27 cell cube. Cubes have Oh symmetry. Inside the 27 cube of FIG. 14 (item 1406, 1407, and 1408 show the end face of three of the 6 apices of the central octahedron) are the cells that make up the octahedron, as was shown in FIG. 1B. There may be any number of cell train inputs and outputs. Four are draw for visual clarity; they are line originating at 1402, 1403, and ending at 1401 and 1405. Line 1404 also is connected to the 27 cell cube.

Many wavelengths of light may be introduced to the 27 cube. Each cell in the 27 cube should have the appropriate antenna-like sites to absorb and retransmit pulses or in some instances cause photon twinning and two photon absorption.

Strategic introduction of photon twinning for some wavelengths of light makes the 27 cube a kind of nano-scale reactor of photons. Additive processes of energy must be simultaneous, for example, if pulse of energy 2$\epsilon$ combines with a second of the same energy to cause a re-transmission at a 4$\epsilon$ site those two 2$\epsilon$ quanta must combine simultaneously. With those simple rules and the rules set forth earlier it becomes apparent that simultaneous introduction of many wavelengths of light at the apices of the octahedron may take on a certain pattern depending on the symmetry of the pulses introduced into the octahedron.

As mentioned previously, the photons also may act as tiny particles with orbitals that can cause a pulse transfer when two equal and opposite energy events have the orbitals overlap and transfer energy. As mentioned previously, it may be possible to utilize over a thousand wavelengths of light in the same location at the same time. In the case of an octahedron, combinations of photons of the same or different wavelengths may be introduced. The number of perturbations possible would be as if there were over 1000 ligands (the word is used as in the "ligand" term in chemistry which are molecular groups attached to transition metal in a complex) that could attach to the equatorial and axial positions of an octahedron molecule.

The influx of a group of pulses inlet at key positions in cells arranged in an Oh symmetry trigonal antiprism may process incoming pulses into signature outgoing readouts. Parallel flowing pulses of various wavelengths may be processed simultaneously in the same octahedron arrangement making an extremely large number of perturbations within a single 27 cell arrangement.

For example, 1,000 different wavelengths of light are used and each of these 1,000 can be READ eventually (methods of reading describe in next section), then essentially the system has the properties of a generic octahedron transition metal complex with the choice of 1,000 types of entities that can be introduced at the locations where ligands would normally be placed in a transition metal complex.

Now it is known in the inorganic chemistry literature and in group theory of platonic shapes that there are 48 symmetry operations possible within an Oh shape and that the Oh symmetry can drop to lower symmetry entities if the apices are occupied by differing ligands in the case of transition metal complexes, and light pulses in the case of the current discussion. An octahedron has six apices, 2 axial and 4 equatorial sites. There are many perturbations of apice occupation. For example 5 ligands may be similar and 1 different, or 4-and-2 different or 3-and-3 different or 2-and-4 different or all different. The ligands provide further perturbations by placing the different ligands in the axial or equatorial positions of the octahedron. For example if the octahedron has 3 ligands A and ligands B, C and D, then 3 A can be equatorial or 2 A equatorial or B and C take the two equatorial positions or C and D take the equatorial positions, and so on. A 1,000 ligands placed on the 6 or 8 positions of octahedral apices with further perturbations as to how they are placed creates a tremendous amount of variation within a 27 cell volume. The ligands in the sense of chemistry atoms can be replaced with all the same symmetry obligations by pulses of various wavelengths. Therefore a tremendous number of patterns of pulses can be generated in a 27 cell volume.

FIG. 14 shows further that the cell must have a reading antenna train, which is shown with an arrow and marked as 1401. All the additions and subtractions of wavelengths within the 27-cell processing array will generate in most cases a unique set of wavelength readouts. This can be further controlled because the array architect may include or not certain re-transmitters, in other words $2\epsilon$ may be allowed to combine to $4\epsilon$ and $8\epsilon$ and $16\epsilon$ but not 6, 10, 12, and 14, if by doing so creates signature uniqueness benefits. The reader may calculate for themselves the number of perturbations in unique signatures possible in that 27-cell example.

Even if the cells are 2 microns each in diameter the number of signatures of information that can be processed in such 216 $\mu m^3$ location exceeds by far the same that can be accomplished with electron-based gates, despite smaller-and-smaller nanometer sized transistors planned by the Industry for classical computing systems.

Each 27-cell array may itself be the apices of a superstructure of six 27-cell arrays places in a super-octahedron. This is shown in FIG. 15. In FIG. 15 (item group 1500), the center group 1 of cubes are shown in a two dimensional depiction and show an octahedron of cells as in FIG. 1B that has cell train communication to 4 other octahedron of cubes, groups 2, 3, 4 and 5. Octahedron groups 2, 3, 4, and 5 also have cell trains leading to other locations, and some examples are shown in FIG. 15 indicated as 1502, 1503, 1504 and 1505. There may be other inputs to each octahedron, not shown in the schematic, that come in and out of the plane. These are difficult to depict but can also be part of the cell architecture. The octahedron 1, 2, 3, 4 and 5 may have cell trains that input various pulses of various wavelengths to the axial and equatorial sites of each octahedron. The exits from 2, 3, 4 and 5 may feed their resulting pulse signatures to octahedron 1. When pulse addition is used in a given octahedron, meaning two wavelengths of energy $\epsilon$ are emitted by two antenna-like sites, but then absorbed by one antenna-like site or energy $2\epsilon$, then the octahedron is like a nanoscale reactor that provides different output, depending on the input to each octahedron, 2, 3, 4 and 5, which then all have unique outputs that feed into the center octahedron 1. Not shown in the schematic of FIG. 15 is there is a train of cells that allow the inputs to octahedron 1 to exit and move towards a READ device that eventually consumes the pulses during the reading process. In this example, which not meant to limit all the possibilities of embodiments taught by this document, a superstructure of six 27-cells that are 2 microns per cell would have a foot print of 36 $\mu m^2$ and provide a practical method to obtain the Quibit-level information processing.

In order to engineer pulse processes, the motion of newly generated TEM pulses through cells requires a mathematical quantification for building and predicting the behavior of nano- or micro-scale transmitter-to-absorber/re-transmitter for creating preferred pathways for pulses and nano-thermodynamic methods for quantifying the materials required to construct Logic Gates in analogy to electric-current based Logic Gates. The current document provides this.

Further the nano-thermodynamic analysis is essential in order to build light-pulse based Logic Gates, since behavior of materials at the nano-scale is different than the macroscopic scale and there is a lack in the scientific prior art describing methods and engineering at the nano scale. At the nano scale processes can no longer rely on macroscopic continuum heat transfer, mass transfer, work and power, and thermodynamic unit operations. In the next section, the embodiments presented (for illustrative purposes without limiting the scope of the claims) describe the methods for conducting nano-scale engineering unit operations and the related materials of construction required to build determined, cascadable, light-based Logic Gates.

The literature describes many instances of travelling pulses in biological cells in conjunction with life science processes. The absorption and retransmission of photons of TEM pulses happens throughout biochemistry and inorganic chemistry. For example, nerve impulses propagate a succession of spikes or pulses transmitting electrical potential. Much biological interest is focused on spiral wave mathematics in relation to electrical potential pulses, charged ion waves and ion channel physics [Sensing with Ion Channels, Boris Martinac (Ed.), Springer, 2008].

Example Materials for Constructing Pulse Fields:

According to an embodiment, although claimed subject matter is not limited in this respect a "lock and key" mechanism related to the models used in small molecule pharmaceuticals can be used to generate electromagnetic spherical wave pulses.

In this method a docking agent is associated with a cell. The docking ("lock") agent can be attached to the cell wall, while the "key" is a molecule that has freedom of motion within the cell body.

In biology, the cells are composed of fluid medium, such as a water-base, containing ions and carbon-based biopolymers, however, when constructing a computing device, only the physics principles need to be adhered to, and it is possible to also make cells that have gas-phase multi components in the body volume.

It is known that upon docking in some biological systems, that the key molecule has a multi-coordinate docking with the "lock" molecule. Although the word "lock" is used, it should be clear that all the associative docking and dissociative anti-docking are in the majority of cases fully reversible processes.

The key molecule docking to the lock generates a energy related to the formation of bonds and anti-docking requires an energy related to breaking bonds. It should be understood that any chemical combination capable of operating in the action described herein may be used. However, the invention is by no means limited to this mechanism of creating the electromagnetic pulses. Indeed any mechanism, chemical or otherwise, may be used to create such a pulse.

As described in U.S. 61/741,485, incorporated herein by reference, there are a number of entropy loss reactive steps upon docking that are in the overall docking cycle compensated for by entropy gain reactive steps, but significantly there may be a reactive step that would require instantaneous entropy contraction. These processes include but are not limited to:

Conformational entropy changes constituting simultaneous loss of a group of system states include but are not limited to:
Symmetry of the key-molecule decreased upon binding to docking agent since it approaches the docking from a particular geometric direction
Bond Torsional degrees of freedom lost in key-molecule and docking site
Docking agent constrains key-molecule to a single conformation.
Docking agent looses degrees of freedom in motion upon key-molecule association
Two entities (key-molecule and docking agent) that had individual kinetic energy freedom (the key molecule having translational kinetic freedom) before reversible binding behave as one entity after reversible binding (with the key molecule loosing substantial translational kinetic freedom).

An instant of negative conformational entropy change requires instantaneous entropic compensation in-order for the binding event to occur. Particular molecules docking to particular binders require a specific quantum of energy to enable dissociation and produce a specific quantum of energy when reversible docking bonds are formed.

This reversible docking step is the transmitting "antenna-like" step that provides an energy pulse which is received by the anti-docking step. The term multi-coordinate reversible binding, docking and association are used to indicate the same event. The multi-coordinate nature of the docking affects the symmetry of the key-molecule since from several geometric directions the molecules shape is contorted.

In FIG. 11 a generalized entropy energy quanta swapping pair was described. Now in this more detailed embodiment, the event part 1101 is the key molecule that may dock to event part 1102 (the lock). Event part 1103 is the docking site in another location that dissociates reversibly event part 1104 which is another identical key molecule. Event parts 1103 and 1104 are the components of Anti-docking events.

An antenna-like site may be in one example a transmitter (of energy quantum dε) that is energized by the multi-coordinate docking of a molecule on to a reversible binder, however the instantaneous entropy change, dS for some point in the process of docking is negative, −dS. In FIG. 11 an anti-docking event (labeled as AD in the Figure) requires the same quantum of energy provided by the docking event (labeled as D in the Figure) and provides the positive entropy required, +dS.

Referring to U.S. 61/741,485 ("Cellular Antenna Arrays used in Anti-cancer and Light-based Computing"), the docking and anti-docking pair may generate a wave of "heat", dQ, and work, dW, which are analogous to the electro and magnetic parts of an electromagnetic wave. The system's overall change in internal energy is zero, but dQ and dW are not state functions, they depend on the path. The wave represents all such dQ, dW paths. This generates the characteristic multi-values for the electro and magnetic parts of the electromagnetic wave that are equal in magnitude but orthogonal vectors.

The docking and anti-docking pair can be used to send and receive a signal. In order to use liquid phase docking processes while increasing the rate of docking as compared with pharmaceutical processes, the key molecule that reversibly binds can kept more closely in vicinity of the docking site. This can be done in at least three ways: (1) By increasing the concentration of the molecule used to reversibly bind within the cell. Brownian motion processes will allow for the key molecule to diffuse to the docking site. (2) By tethering the key molecule by an oligomer chain in the vicinity (less than 10 nanometers) of the docking site. Or (3) by use of gas phase key molecules which inherently have faster diffusion, as compared with liquid phase.

Traveling at the speed of a gas at room temperature within the cell that houses the docking site, the time period for gas phase molecule to collide with docking agent may be estimated by the kinetic gas theory [Kinetics of Heterogeneous Catalytic Reactions, Michel Boudart and Djega-Mariadassou, 1084], and at room temperature may for key molecule to travel a tenth of a 1 μm cell to collide with a $10^{-4}$ μm² docking agent may require $10^{-2}$ seconds.

As compared with electric current based microprocessors or to a new low temperature superconducting quantum computer, the process of transmitting and retransmitting a light-pulse through two-body associative and dissociative reaction increases in rate with increasing temperature. This is a desirable feature, since increasing temperature is the typical way chemical process rates are usually increased and there is a lot of engineering information about increasing temperature. Room temperature processes are also useful in a product, and the TEM pulse processes described in this document could take place at room temperature.

For electric current processes, usually, very low, lower or moderate temperature is helpful. However, for key molecule to diffusion, higher temperature increases rate of diffusion and higher temperature may increase the rate of docking reaction.

Since the enthalpy of the docking reaction is matched equal and opposite to the enthalpy of the dissociation reaction, and that these energies are provided by the transference of an electromagnetic wave pulse, logic gates constructed in this manner will not generate waste heat as electric current based logic gates do. The light-pulse based logic gates may be operated at room temperature or may be operated at elevated temperature to increase the speed of processes.

While it is possible to use liquid phase cell volumes, or ideal gas in the cell volumes or plasma or free radicals or gas phase ions or supercritical fluids, it is instructive to look at the diverse use of waves in normal biological cellular functions. Although fast-pace gas phase docking and anti-docking reactions are beneficial for the shortened time for processes, liquid phase docking and anti-docking benefits from a wealth of information on biological docking sites and the types of molecules that are drug-like. For these molecules we expect a molecular weight in the 350 grams/mole range. Gas phase molecules depending on the temperature and pressure of operations, often have a lower molecular weight.

Ion channels and nerve impulses use concentration waves to undergo several normal processes. These waves are often_not electromagnetic but prevalent in physiological processes.

Experimental results have shown that radiant energy in the 1 to 1000 μm wavelength on human or mammalian bodies have (1) generated beneficial nitric oxide (NO), (2)

modifies the structure of DNA and RNA, (3) is beneficial against breast cancer, (4) helps in wound healing.

Far infrared light has been successfully used on human cell-wound healing ["Effect of Light-emitting Diode Irradiation on Wound Healing", Harry T. Whelan, et. al., Medical College of Wisconsin, Journal of Clinical Laser Medicine and Surgery, Volume 19, No. 6 (December 2001)]. Research may indicate the mechanism for far infrared light skin healing is by providing the proper wavelength of energy required for new tissue growth and mending processes.

Assuming typical conformational negative entropy changes from drug discovery literature, an estimate of electromagnetic waves generated can be made. TdS (binding rotational entropy loss)≈58.5 kJ/mol+n(6 kJ/mol) (estimated for a drug of mass 200 Da and for a receptor of mass >2 kDa with the n representing the number of single bonds restricted in their free rotation upon docking.) But later the authors indicated a maximum value of $TdS_{rt}$ loss of 60 kJ/Mol. Estimating with:

$$E = \frac{hc}{\lambda}\left[\frac{60{,}000\ \frac{J}{mol}}{6.62 \times 10^{-34} J \times s\left(2.99 \times 10^8 \frac{m}{s}\right)(6.02 \times 10^{23}/mol)}\right]^{-1} = \lambda > 2\ \mu m$$

Indicating conformational entropy restriction on pharmaceutical type docking may generate wavelengths in the range of Near Infrared, Mid Infrared and Far Infrared (15-1,000 μm). The electromagnetic wavelength estimate is on the dimension scale of the human cell size.

It is well-known that DNA conformational changes are triggered by DNA absorption of far infrared electromagnetic waves. Far infrared causes conformational changes in DNA [Far-infrared spectroscopy on oriented films of dry and hydrated DNA Phys. Rev. A 34, 493-500 (1986), Poglitsch et, al]. In one study Far-infrared measurements, between 3 and 450 $cm^{-1}$, of absorption spectra of highly oriented films of Li-DNA and Na-DNA in the temperature range 5-300 K show five low-frequency infrared-active vibrational modes.

It is known that far infrared induces intracellular generation of nitric oxide [Journal of Medical and Biological Engineering, 29 (1) 15-18, 2008]. Far infrared has been shown to influence mamillian body processes in many instances in the scientific literature [Y. Udagawa and H. Nagasawa, "Effects of Far-Infrared Ray on Reproduction, Growth, Behaviour and Some Physiological Parameters in Mice," In Vivo, Vol. 14, No. 2, 2000, pp. 321-326 and S. Inoue and M. Kabaya, "Biological Activities Caused by Far-Infrared Radiation," *International Journal of Bio-meteorology*, Vol. 33, No. 3, 1989, pp. 145-150.]

Human skin offers an opportunity to measure the generation of far infrared electromagnetic waves about docking, since the skin is asymmetric, meaning it can be modeled as a flat plat, unlike the other organs of the body, and the skin is accessible by far infrared measuring devices and docking stimulation.

The total energy/enthalpy of docking in pharmaceutical processes is not the exact measure of the pulse wavelengths that would be required, since the step in the docking that determines the pulse energy is a certain instantaneous entropy loss step during docking. It would be instructive to use the large amount of information on key molecule docking in pharmaceutical processes. In order to quantify intercellular electromagnetic wave generation in mammals a simple experiment may be undergone using a known skin docking agent, such as a contact sensitization hapten over an area of skin near to a far infrared probe at the human skin. Simply a thin membrane capable of quickly wicking a solution of known contact sensitization hapten is to be placed on the skin of a person who is sensitive to the chemical agent. Preferably the docking location and dS of conformational changes should be known for the hapten used to sensitize and possible cause a rash in the human subject. Measurement of the FIR will indicate the energy and entropy processes happening at the docking event.

It is assumed from kinetics that the first introduction of hapten into the skin would cause the largest FIR signal that could be measured at the skin surface, since the first action would be unsteady state binding of hapten to receptor.

The same principles that govern newly initiated spherical electromagnetic wave pulses also have a role in the human cell-to-cell energy transactions. Tumor growth requires large energy influx from healthy tissue. The methods described herein are generally applicable to problems inherently involving or intentionally engineered with the intent to utilize cell-to-cell pulse control.

During the growth of tumors there is excessive DNA conformational changes associated with TEM wave energy input. The building up of tissue structure requires a large input in energy. Here the tumor may usurp energy pulses within an organ for use to build invasive tissue. Tumor's become more dense and necessarily increase in their index of refraction, therefore the process of tumor growth is autocatalytic, meaning the more it grows the more it takes TEM energy pulses meant for healthy bodily processes, because (1) its surface area for transference of pulses increases, and (2) its index of refraction increases. Increased index of refraction in tumors in the human body may cause processes similar to the dual capacitor of FIG. 18. Here energy transactions within the high index of refraction volume are preferred over intercellular energy transfer processes. Further the growing tumor consumes energy pulses not making them available for healthy physiological processes.

Tumors should be deprived of this electromagnetic wave energy input. To do so, and reestablish healthy tissue of an organ the electromagnetic waves should be (1) reflected away from the tumor location, (2) in some way blocked from arriving to a growing tumor, or (3) give the tumor a tumor by robbing the unhealthy growth of energy pulses. To rob the unhealthy growth of energy pulses within the tumor or on its surface or both low index refraction material and absorber/re-transmitters are placed so as to direct energy pulses away from the unhealthy growth and recycled towards healthy tissue to promote healthy physiological processes.

Using the methods described in this document it may be possible to redirect energy pulses within organs of the human body in order to re-establish symmetrical energy transformations.

Three Dimensional Stacks of Light-Based Transistors:

The TEM spherical pulse operations describe in this document do not generate waste heat. The cellular arrays can be placed in three dimensional shapes without the need to remove heat.

Arrangement of electric-current based transistors in three dimensional stacks creates a problem in removing the heat generated in the sandwiched layers. Therefore the number of logic gates that fit in the same area foot print for TEM spherical pulse logic gates is greatly increased since the logic gates can be stacked, with only reflective materials used between cell trains to induce the pulses to stay in the appropriate track.

Since single photon operations have been outlined, which may accomplish computations and information representation, the annihilation of photons to READ their existence and to clear photons left in capacitance, is still a very small energy consumption per computation as compared with electric current based transistors which also have loss processes that lead to no particularly useful outcome besides irreversibility of processes.

Therefore the problem of excessive power consumption from computations and microprocessor cooling may be solved.

What is claimed is:

1. A computing apparatus comprising:
   a) a key that that is either a key molecule, ion, electron or photon and has freedom of motion within a cell body;
   b) a cell body that has length, width and height in the range of $10^{-9}$ to $10^{-4}$ meters, defining a cell-volume;
   c) wherein walls of the three dimensional cells are made of material that can anchor an antenna-like transmitter/receiver that is capable of transmitting and receiving and re-transmitting a radiant energy pulse;
   d) wherein antenna-like processes happen through dissociative key anti-docking and associative key docking that are both reversible processes;
   e) wherein dissociative anti-docking and associative docking are coupled events wherein a quantum of energy from associative docking together with negative differential entropy is coupled with the equal and opposite quantum of energy for dissociative anti-docking together with positive differential entropy; and
   f) wherein the dissociative key anti-docking and associative key docking coupled events can be used to move a signal of quantized energy.

2. The apparatus of claim 1 that includes said signals, which are characterized by early stage spherical pulses that radiate through arrays of three dimensional cells and said cells are kept isothermal, constant temperature.

3. The apparatus of claim 1 wherein the key can be a molecule that can engage in multi-coordinate interaction with a docking site.

4. The apparatus of claim 3 wherein a key molecule docking to an antenna-like site generates an energy related to the formation of bonds and anti-docking requires an energy related to breaking bonds and the enthalpy of the docking reaction is matched equal and opposite to the enthalpy of the dissociation reaction.

5. The apparatus of claim 3 wherein the step in the docking that determines the radiant pulse energy quantum magnitude is an instantaneous entropy loss step that is part of the key molecule docking process in which the total energy/enthalpy of docking processes may not be the measure of the pulse wavelengths.

6. The apparatus of claim 5 wherein an entropy contraction step, which is part of multi-coordinate docking of a key molecule onto a reversible binder, energizes a quantum of energy to be transmitted over the antenna-like sites.

7. The apparatus of claim 5 wherein the quantized energy which happens at the docking event may be Far Infrared.

8. The apparatus of claim 3 wherein antenna-like transmitting and receiving and re-transmitting, in contrast to a low temperature superconducting quantum computer, is a two-body associative and dissociative key molecule and antenna-like site condensation and anti-condensation reaction that can benefit from increasing temperature by increase in reaction rate.

9. The apparatus of claim 3 wherein a docked key molecule and antenna-like tethered docking site may be molecules, elements, transition metal complexes, nanoparticles, quantum dots or a pharmaceutical style docking site with drug-like molecule reversibly associated.

10. The apparatus of claim 1 wherein the docking is the absorption of a photon in an element, molecule, nanoparticle or quantum dot.

11. The apparatus of claim 1 that operates at room temperature, or human body temperature or any temperature that allows for the functioning of binding and anti-binding.

12. The apparatus of claim 1 wherein pulses are controlled by allowing or disallowing a pulse to move in a particular direction by use of second pulse or providing a driving force for pulse determined moving by increased Index of Refraction in cell-to-cell pathways.

13. The apparatus of claim 1 wherein cells have energy quanta saturation capacity, which is determined by the anti-docking acceptance of a limited input of quantized energy related to key dissociation.

14. The apparatus of claim 13 wherein capacitance of the cells to absorb pulses is saturated by additional quantized energy input.

15. The apparatus of claim 14 wherein an AND Gate is comprised of at least one cell with an increased Index of Refraction and with an increased number of antenna-like sites in which a first quantum of energy is put in capacitance in the increased Index of Refraction cell and another quantum of energy is used to saturate the capacitance in order to let a quantum of energy pass the AND Gate.

16. The apparatus of claim 15 wherein the quantized energy pulse still trapped in the gate can be cleared by annihilation.

17. The apparatus of claim 15 wherein said AND Gate has cascadable properties, in which the signal, represented by the energy pulse that passes the gate, is unchanged in magnitude by passing the gate.

18. The apparatus of claim 1 wherein the mass of the tethered antenna-like site is greater than the mass of the key molecule.

19. The apparatus of claim 1 wherein
   a) the cell volume is composed of a liquid phase or gas phase volume or plasma or free radicals or gas phase ions or supercritical fluids;
   b) the cell walls may be composed of organic, carbon-based material;
   c) a key uses molecular liquid Brownian motion processes or gas phase motion to allow for diffusion to a docking site; and
   d) a photon is used to initiate the signaling.

20. The apparatus of claim 19 wherein liquid phase cell volume is water; or liquid mixture as in a biological cell; or a suitable solvent for the binding molecule to solubilize, when it is not bound.

* * * * *